(12) United States Patent
Nakamura et al.

(10) Patent No.: US 11,856,808 B2
(45) Date of Patent: Dec. 26, 2023

(54) ORGANIC ELECTROLUMINESCENT ELEMENT AND ELECTRONIC DEVICE DRIVABLE AT LOW VOLTAGE WITH IMPROVED LIFETIME

(71) Applicant: IDEMITSU KOSAN CO., LTD., Tokyo (JP)

(72) Inventors: Masato Nakamura, Sodegaura (JP); Emiko Kambe, Sodegaura (JP); Hiroaki Toyoshima, Sodegaura (JP); Kazuki Nishimura, Sodegaura (JP); Hitoshi Kuma, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 29 days.

(21) Appl. No.: 15/734,761

(22) PCT Filed: Jun. 4, 2019

(86) PCT No.: PCT/JP2019/022164
§ 371 (c)(1),
(2) Date: Dec. 3, 2020

(87) PCT Pub. No.: WO2019/235475
PCT Pub. Date: Dec. 12, 2019

(65) Prior Publication Data
US 2021/0242419 A1    Aug. 5, 2021

(30) Foreign Application Priority Data
Jun. 4, 2018   (JP) ................................ 2018-107244

(51) Int. Cl.
*H10K 50/15*  (2023.01)
*H10K 50/19*  (2023.01)
(Continued)

(52) U.S. Cl.
CPC ............. *H10K 50/15* (2023.02); *H10K 50/19* (2023.02); *H10K 50/818* (2023.02); *H10K 2102/351* (2023.02)

(58) Field of Classification Search
None
See application file for complete search history.

(56) References Cited

U.S. PATENT DOCUMENTS

| 2003/0189401 A1 | 10/2003 | Kido et al. |
| 2007/0182317 A1 | 8/2007 | Kido et al. |

(Continued)

FOREIGN PATENT DOCUMENTS

| JP | 2003-272860 A | 9/2003 |
| JP | 2012-186092 A | 9/2012 |

(Continued)

OTHER PUBLICATIONS

International Preliminary Report on Patentability, issued in connection with International Patent Application No. PCT/JP2019/022164, dated Dec. 8, 2020.

(Continued)

*Primary Examiner* — Daniel Whalen
(74) *Attorney, Agent, or Firm* — Foley & Lardner LLP

(57) ABSTRACT

An organic electroluminescence device includes a first emitting unit, a first charge generating layer, a second emitting unit, a second charge generating layer, and a third emitting unit provided between an anode and a cathode in this order from the anode, in which the second charge generating layer includes an N layer close to the anode and a P layer close to the cathode, the third emitting layer contains a blue fluorescent compound, at least one of the first or second emitting layer contains a blue fluorescent compound, the third emitting unit includes a hole transporting zone between the second charge generating layer and the third emitting layer, (Continued)

the hole transporting zone is in contact with the second charge generating layer, and a thickness of the hole transporting zone is in a range from 5 nm to 40 nm and smaller than a thickness of the N layer.

20 Claims, 3 Drawing Sheets

(51) Int. Cl.
*H10K 50/818* (2023.01)
*H10K 102/00* (2023.01)

(56) References Cited

U.S. PATENT DOCUMENTS

| | | | |
|---|---|---|---|
| 2014/0151648 A1 | 5/2014 | Kido | |
| 2014/0299854 A1 | 10/2014 | Mizuno | |
| 2015/0155513 A1 | 6/2015 | Pieh et al. | |
| 2015/0228921 A1 | 8/2015 | Kambe et al. | |
| 2015/0249230 A1 | 9/2015 | Kido | |
| 2015/0303391 A1 | 10/2015 | Nishimura et al. | |
| 2016/0104844 A1* | 4/2016 | Kang | H01L 51/0073 257/40 |
| 2017/0194387 A1 | 7/2017 | Oh et al. | |
| 2017/0200920 A1 | 7/2017 | Nishimura et al. | |
| 2018/0019408 A1* | 1/2018 | Ko | H01L 51/5004 |
| 2018/0277796 A1 | 9/2018 | Kido et al. | |
| 2018/0277797 A1 | 9/2018 | Kido et al. | |
| 2018/0351134 A1 | 12/2018 | Kido et al. | |
| 2020/0099005 A1 | 3/2020 | Tanaka | |

FOREIGN PATENT DOCUMENTS

| | | |
|---|---|---|
| JP | 2014-110348 A | 6/2014 |
| JP | 2014-212102 A | 11/2014 |
| JP | 2015-153523 A | 8/2015 |
| JP | 2016-149368 A | 8/2016 |
| JP | 6151847 B1 | 6/2017 |
| KR | 2017-0143292 A | 12/2017 |

OTHER PUBLICATIONS

International Searching Authority, "International Search Report," issued in connection with International Patent Application No. PCT/JP2019/022164, dated Sep. 3, 2019.

International Searching Authority, "Written Opinion," issued in connection with International Patent Application No. PCT/JP2019/022164, dated Sep. 3, 2019.

* cited by examiner

ORGANIC ELECTROLUMINESCENT ELEMENT AND ELECTRONIC DEVICE DRIVABLE AT LOW VOLTAGE WITH IMPROVED LIFETIME

CROSS-REFERENCE TO RELATED APPLICATIONS

The present application claims priority under 37 U.S.C. § 371 to International Patent Application No. PCT/JP2019/022164, filed Jun. 4, 2019, which claims priority to and the benefit of Japanese Patent Application No. 2018-107244, filed on Jun. 4, 2018. The contents of these applications are hereby incorporated by reference in their entireties.

TECHNICAL FIELD

The present invention relates to an organic electroluminescence device and an electronic device.

BACKGROUND ART

There has been known an organic electroluminescence device (hereinafter, referred to as an "organic EL device") that includes an emitting unit, in which an emitting layer is included, between an anode and a cathode and emits light using exciton energy generated by a recombination of holes and electrons that have been injected into the emitting layer.

Recently, there has been studied an arrangement of the organic EL device having a plurality of emitting units laminated through a charge generating layer and connected in series. Such an arrangement is also referred to as a tandem organic EL device.

The tandem organic EL device is said to emit light at a lower voltage than a non-tandem organic EL device. Accordingly, the tandem organic EL device has been noticed as a technology for enabling to achieve a long lifetime of the device.

For instance, Patent Literature 1 discloses an organic electrical field light emission device that includes: a plurality of emitting units at least including a first emitting unit having a first emitting layer and a second emitting unit having a second emitting layer; and a charge generating layer disposed between the first emitting unit and the second emitting unit, in which a film thickness of a hole transporting layer in the second emitting unit is in a range from 10% to 25% of a total film thickness of the second emitting unit.

CITATION LIST

Patent Literatures

Patent Literature 1: JP2015-153523 A

SUMMARY OF THE INVENTION

Problems to be Solved by the Invention

However, in recent years, a tandem organic EL device has been required to be driven at a further lower voltage and to have an improved lifetime. Particularly, since blue emission is said to be difficult in a field of an organic EL device, an organic EL device having a blue emitting layer is required to be driven at a lower voltage and to have an improved lifetime.

Although Patent Literature 1 discloses the organic electrical field light emission device having a blue emitting layer, a drive voltage and a lifetime have not been sufficiently studied.

An object of the invention is to provide an organic electroluminescence device drivable at a low voltage with an improved lifetime, and an electronic device including the organic electroluminescence device.

Means for Solving the Problems

According to an aspect of the invention, an organic electroluminescence device includes: an anode; a cathode; a first emitting unit including a first emitting layer; a first charge generating layer; a second emitting unit including a second emitting layer; a second charge generating layer; and a third emitting unit including a third emitting layer, in which the first emitting unit, the first charge generating layer, the second emitting unit, the second charge generating layer, and the third emitting unit are provided between the anode and the cathode in this order from the anode, the second charge generating layer includes an N layer close to the anode and a P layer close to the cathode, the third emitting layer includes a blue fluorescent compound, at least one of the first emitting layer or the second emitting layer includes a blue fluorescent compound, the third emitting unit further includes a hole transporting zone of the third emitting unit between the second charge generating layer and the third emitting layer, the hole transporting zone of the third emitting unit is in contact with the second charge generating layer, and a thickness of the hole transporting zone of the third emitting unit is in a range from 5 nm to 40 nm and smaller than a thickness of the N layer.

According to another aspect of the invention, an electronic device including the organic electroluminescence device according to the above aspect of the invention is provided.

According to the aspects of the invention, an organic electroluminescence device drivable at a low voltage with an improved lifetime, and an electronic device including the organic electroluminescence device can be provided.

DESCRIPTION OF EMBODIMENT(S)

First Exemplary Embodiment

An organic EL device according to a first exemplary embodiment is a tandem organic EL device including three emitting units. The organic EL device of the exemplary embodiment has an exemplary arrangement as follows.

anode/first emitting unit/first charge generating layer/second emitting unit/second charge generating layer/third emitting unit/cathode The emitting units and the charging generating layers each include an organic layer. This organic layer is a laminate of a plurality of layers formed of an organic compound. The organic layer may further contain an inorganic compound.

Figure 1:
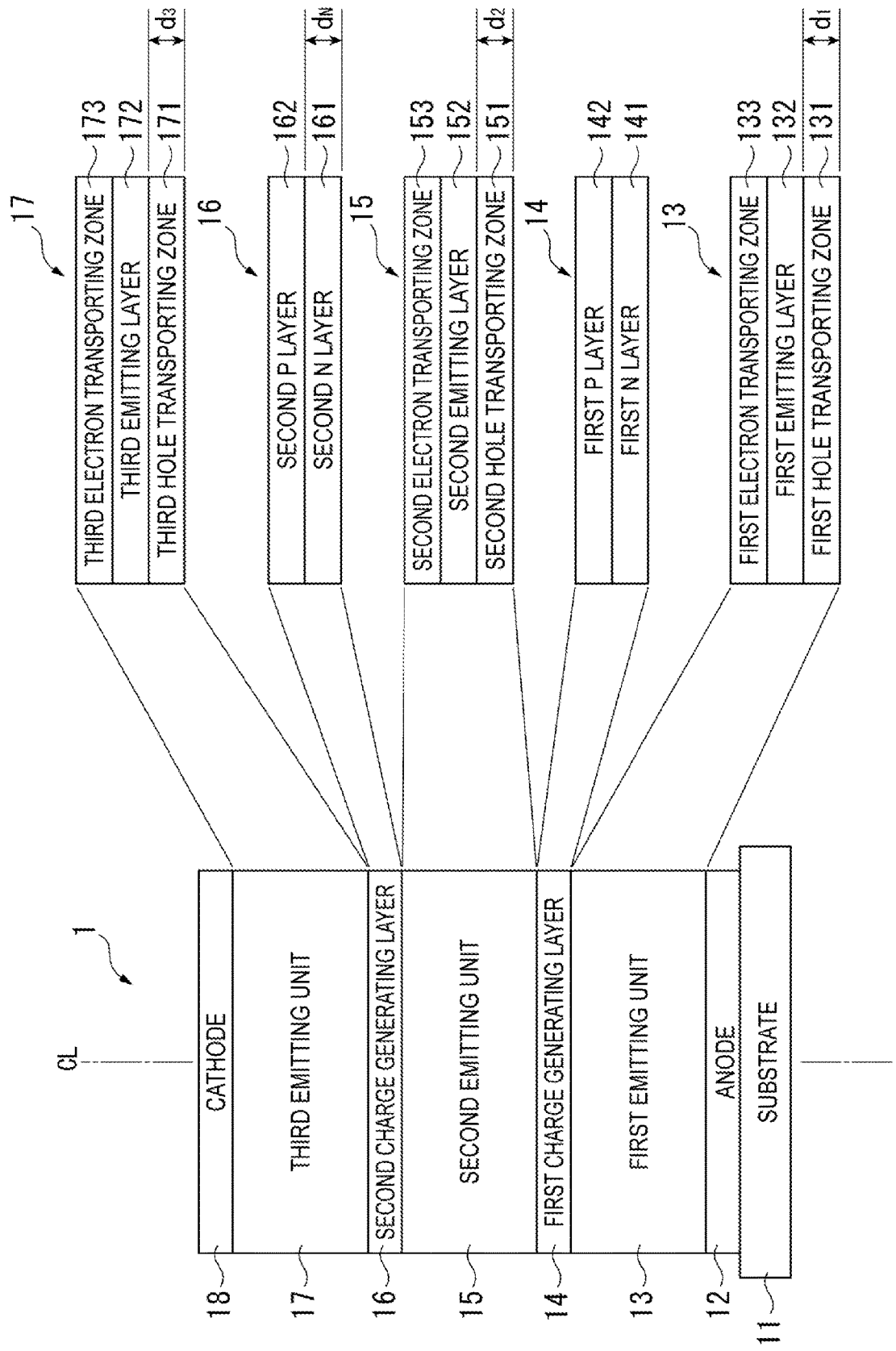
FIG. 1 schematically shows an exemplary arrangement of an organic EL device according to a first exemplary embodiment.

In the exemplary embodiment, a tandem organic EL device 1 having an arrangement as shown in FIG. 1 is described as an example. The organic EL device 1 includes an anode 12, first emitting unit 13, first charge generating layer 14, second emitting unit 15, second charge generating layer 16, third emitting unit 17, and cathode 18 which are laminated on a substrate 11 in this order.

A detailed arrangement of each of the emitting units and the charging generating are as follows.

first emitting unit 13: first hole transporting zone 131 (thickness $d_1$)
first emitting layer 132
first electron transporting zone 133
first charge generating layer 14: first N layer 141
first P layer 142
second emitting unit 15: second hole transporting zone 151 (thickness $d_2$)
second emitting layer 152
second electron transporting zone 153
second charge generating layer 16: second N layer 161 (thickness $d_N$)
second P layer 162
third emitting unit 17: third hole transporting zone 171 (thickness $d_3$)
third emitting layer 172
third electron transporting zone 173

In the exemplary embodiment, the third emitting layer 172 contains a blue fluorescent compound. At least one of the first emitting layer 132 and the second emitting layer 152 contains a blue fluorescent compound.

In other words, the third emitting layer 172 is a blue fluorescent layer. At least one of the first emitting layer 132 or the second emitting layer 152 is a blue fluorescent layer.

The third hole transporting zone 171 is in contact with the second charge generating layer 16.

The thickness $d_3$ of the third hole transporting zone 171 is in a range from 5 nm to 40 nm and is thinner than the thickness $d_N$ of the second N layer 161.

The inventors have found that the organic EL device with the above arrangement can lower a drive voltage and improve a lifetime. This is considered to be due to the following reasons.

In a typical organic EL device including three emitting units, a third hole transporting zone is often formed to be relatively thick in order to use a light-interference effect.

In such a device arrangement, an interface between the third hole transporting zone and the third emitting layer is easily deteriorated. As a result, the drive voltage tends to be increased and the lifetime of the device tends to be shortened.

It is estimated that this is because a supply of holes from the second charge generating layer to the third emitting layer becomes insufficient due to the thickness of the third hole transporting zone and, as a result, a recombination region of the third emitting layer is shifted toward the hole transporting zone.

Accordingly, in the exemplary embodiment, the third hole transporting zone is provided in contact with the second charge generating layer, a thickness of the third hole transporting zone is set as relatively thin as from 5 nm to 40 nm, and instead, a thickness of an N layer of the second charge generating layer is set thicker than the thickness of the third hole transporting zone among a plurality of organic layers in consideration of a resistance of each layer.

With this arrangement, it is conceivable that a supply of holes from the second charge generating layer to the third emitting layer can be promoted and the recombination region of the third emitting layer having shifted toward the hole transporting zone can be expanded toward the electron transporting zone. As a result, it is considered that deterioration at the interface between the third hole transporting zone and the third emitting layer is preventable.

Accordingly, the organic EL device of the exemplary embodiment can lower the drive voltage and improve the lifetime (hereinafter, also referred to as "the effects of the exemplary embodiment").

Further, according to the exemplary embodiment, the luminous efficiency of blue fluorescence is improvable by the third emitting unit satisfying the later-described formulae of optical interference (i.e., numerical formulae (1-3) and (2-3)).

In sum, according to the exemplary embodiment, the drive voltage can be lowered and the lifetime can be improved, and further, the luminous efficiency can be improved.

In FIG. 1, the first emitting unit 13, the second emitting unit 15, and the third emitting unit 17 include the first electron transporting zone 133, the second electron transporting zone 153, and the third electron transporting zone 173, respectively. However, the emitting units may not include the respective electron transporting zones.

In order to further express the effects of the exemplary embodiment, it is preferable that the first emitting unit 13, the second emitting unit 15, and the third emitting unit 17 include the first electron transporting zone 133, the second electron transporting zone 153, and the third electron transporting zone 173, respectively.

Herein, the hole transporting zone means a region in which holes transfer. A hole mobility $\mu^H$ in the hole transporting zone is preferably $10^{-6}$ cm$^2$/[V·s] or more.

The hole transporting zone may be provided by a single layer or a plurality of layers.

Examples of layers forming the hole transporting zone include a hole transporting layer, hole injecting layer, and electron blocking layer.

The hole mobility $\mu^H$ cm$^2$/[V·s] can be measured according to impedance spectroscopy disclosed in JP 2014-110348 A.

The electron transporting zone means a region in which electrons transfer. The electron mobility $\mu^E$ in the electron transporting zone is preferably $10^{-6}$ cm$^2$/[V·s] or more.

The electron transporting zone may be provided by a single layer or a plurality of layers.

Examples of layers forming the electron transporting zone include an electron transporting layer, electron injecting layer, and hole blocking layer.

The electron mobility $\mu^E$ cm$^2$/[V·s] can be measured according to impedance spectroscopy disclosed in JP 2014-110348 A.

The charge generating layer means: a layer (in the exemplary embodiment, a first P layer 142 and a second P layer 162) configured to inject holes into an emitting layer disposed close to the cathode when voltage is applied; and a layer (in the exemplary embodiment, a first N layer 141 and a second N layer 161) configured to inject electrons into an emitting unit disposed close to the anode when voltage is applied.

The thickness $d_3$ of the hole transporting zone (the third hole transporting zone 171) of the third emitting unit 17 is in a range from 5 nm to 40 nm. In order to further express the effects of the exemplary embodiment, the thickness of the third hole transporting zone 17 is preferably in a range from 10 nm to 30 nm, more preferably from 15 nm to 25 nm, further preferably from 15 nm to 20 nm.

When the thickness $d_3$ of the third hole transporting zone 171 is 5 nm or more, quenching due to the acceptor material contained in the second charge generating layer 16 and the third emitting layer 172 being excessively close to each other is suppressed.

When the thickness $d_3$ of the third hole transporting zone 171 is 40 nm or less, a supply of holes from the second charge generating layer 16 to the third emitting layer 172 is promoted, whereby the recombination region in the third emitting layer 172 is likely to expand toward the electron transporting zone.

When the third hole transporting zone 171 includes a plurality of layers, the thickness $d_3$ of the third hole transporting zone 171 means a total thickness of the layers. The same applies to thickness of other zones (e.g., the first hole transporting zone 131) and other layers (e.g., the third emitting layer).

The thickness $d_3$ of the third hole transporting zone 171 is measured as follows.

A central part (code CL in FIG. 1) of the organic EL device 1 is cut in a direction perpendicular to a formation surface of the third hole transporting zone 171 (i.e., in a direction of the thickness of the third hole transporting zone 171). A cut surface of the central part is observed with a transmission electron microscope (TEM).

Thicknesses of other zones (e.g., the first hole transporting zone 131 and the second hole transporting zone 151) and other layers (e.g., the second N layer 161) are measured in the same manner.

The central part of the organic EL device 1 means a central part of a shape of the organic EL device 1 projected from the cathode. For instance, when the projected shape is rectangular, the central part means an intersection of diagonals of the rectangular shape.

In order to further express the effects of the exemplary embodiment, it is preferable that the second hole transporting zone 151 is in contact with the first charge generating layer 14.

The thickness $d_2$ of the second hole transporting zone 151 is preferably in a range from 5 nm to 40 nm, more preferably from 10 nm to 30 nm, further preferably from 15 nm to 25 nm.

In order to further express the effects of the exemplary embodiment, it is preferable that the first hole transporting zone 131 is in contact with the anode 12.

The thickness of the first hole transporting zone 131 is preferably in a range from 5 nm to 40 nm, more preferably from 10 nm to 30 nm, further preferably from 15 nm to 25 nm.

In order to further express the effects of the exemplary embodiment, the thickness of the N layer (the second N layer 161) of the second charge generating layer 16 is preferably 40 nm or more, more preferably 45 nm or more, further preferably 50 nm or more.

In order to obtain a light-interference effect, an upper limit value of the second N layer 161 is preferably 200 nm or less, more preferably 160 nm or less, further preferably 120 nm or less.

In sum, the thickness of the N layer of the second charge generating layer 16 is preferably in a range from 40 nm to 200 nm, more preferably from 45 nm to 160 nm, further preferably from 50 nm to 120 nm.

In order to further express the effects of the exemplary embodiment, a ratio (thickness $d_N$/thickness $d_3$) of the thickness $d_N$ of the N layer (the second N layer 161) of the second charge generating layer 16 relative to the thickness $d_3$ of the hole transporting zone (the third hole transporting zone 171) of the third emitting unit 17 is preferably more than 1 and 40 or less, more preferably from 2 to 10, further preferably from 2.5 to 6.

In the organic EL device 1 of the exemplary embodiment, one of the anode 11 and the cathode 18 is a reflective electrode.

The organic EL device 1 of the exemplary embodiment preferably satisfies a numerical formula (1-3) and a numerical formula (2-3) below in order to draw more light-interference effect to further express the effects of the exemplary embodiment. With this arrangement, a luminous efficiency of blue fluorescence is also improvable.

$$n_3-0.25 < m_3 < n_3+0.25 \qquad (1\text{-}3)$$

In the numerical formula (1-3), $n_3$ represents an integer of 0 or more, and $m_3$ represents an order of interference between the reflective electrode and a light-emitting center of the third emitting layer. $n_3$ is preferably an integer from 0 to 3.

Numerical Formula 1

$$m_3 = \frac{2L_3}{\lambda_3} + \frac{\Phi_3}{2\pi} \qquad (2\text{-}3)$$

In the numerical formula (2-3), $m_3$ represents the same as $m_3$ in the numerical formula (1-3), $L_3$ represents an optical distance (nm) between the reflective electrode and the light-emitting center of the third emitting layer, $\lambda_3$ represents a main peak wavelength (nm) of light emission from the third emitting layer, and $\phi_3$ represents a phase change when the light emission from the third emitting layer is reflected on the reflective electrode.

The organic EL device 1 of the exemplary embodiment also preferably satisfies a numerical formula (1-2) and a numerical formula (2-2) below in order to draw more light-interference effect to further express the effects of the exemplary embodiment.

$$n_2-0.25 < m_2 < n_2+0.25 \qquad (1\text{-}2)$$

In the numerical formula (1-2), $n_2$ represents an integer of 0 or more, and $m_2$ represents an order of interference between the reflective electrode and a light-emitting center of the second emitting layer. $n_2$ is preferably an integer from 0 to 3.

Numerical Formula 2

$$m_2 = \frac{2L_2}{\lambda_2} + \frac{\Phi_2}{2\pi} \qquad (2\text{-}2)$$

In the numerical formula (2-2), $m_2$ represents the same as $m_2$ in the numerical formula (1-2), $L_2$ represents an optical distance (nm) between the reflective electrode and the light-emitting center of the second emitting layer, $\lambda_2$ represents a main peak wavelength (nm) of light emission from the second emitting layer, and $\phi_2$ represents a phase change when the light emission from the second emitting layer is reflected on the reflective electrode.

The organic EL device 1 of the exemplary embodiment also preferably satisfies a numerical formula (1-1) and a numerical formula (2-1) below in order to draw more light-interference effect to further express the effects of the exemplary embodiment.

$$n_1 - 0.25 < m_1 < +0.25 \quad (1\text{-}1)$$

In the numerical formula (1-1), $n_1$ represents an integer of 0 or more, and $m_1$ represents an order of interference between the reflective electrode and a light-emitting center of the first emitting layer. $n_1$ is preferably an integer from 0 to 3.

Numerical Formula 3

$$m_1 = \frac{2L_1}{\lambda_1} + \frac{\Phi_1}{2\pi} \quad (2\text{-}1)$$

In the numerical formula (2-1), $m_1$ represents the same as $m_1$ in the numerical formula (1-1), $L_1$ represents an optical distance (nm) between the reflective electrode and the light-emitting center of the first emitting layer, $\lambda_1$ represents a main peak wavelength (nm) of light emission from the first emitting layer, and $\phi_1$ represents a phase change when the light emission from the first emitting layer is reflected on the reflective electrode.

In order to draw more light-interference effect to further express the effects of the exemplary embodiment, the organic EL device 1 of the exemplary embodiment preferably satisfies the numerical formulae (1-3) and (2-3), the numerical formulae (1-2) and (2-2), or the numerical formulae (1-3) and (2-3). With this arrangement, the luminous efficiency of blue fluorescence is improvable in addition to the effects of the exemplary embodiment.

In order to draw more light-interference effect to further express the effects of the exemplary embodiment, it is more preferable that the organic EL device 1 of the exemplary embodiment satisfies the numerical formulae (1-2) and (2-2) in addition to the numerical formulae (1-3) and (2-3), or satisfies the numerical formulae (1-1) and (2-1) in addition to the numerical formulae (1-3) and (2-3). With this arrangement, the luminous efficiency of blue fluorescence is more improvable in addition to the effects of the exemplary embodiment.

It is further preferable that the organic EL device 1 of the exemplary embodiment satisfies all the numerical formulae (1-1) to (1-3) and the numerical formulae (2-1) to (2-3) in order to draw more light-interference effect to further express the effects of the exemplary embodiment. With this arrangement, the luminous efficiency of blue fluorescence is further improvable in addition to the effects of the exemplary embodiment.

Figure 2:
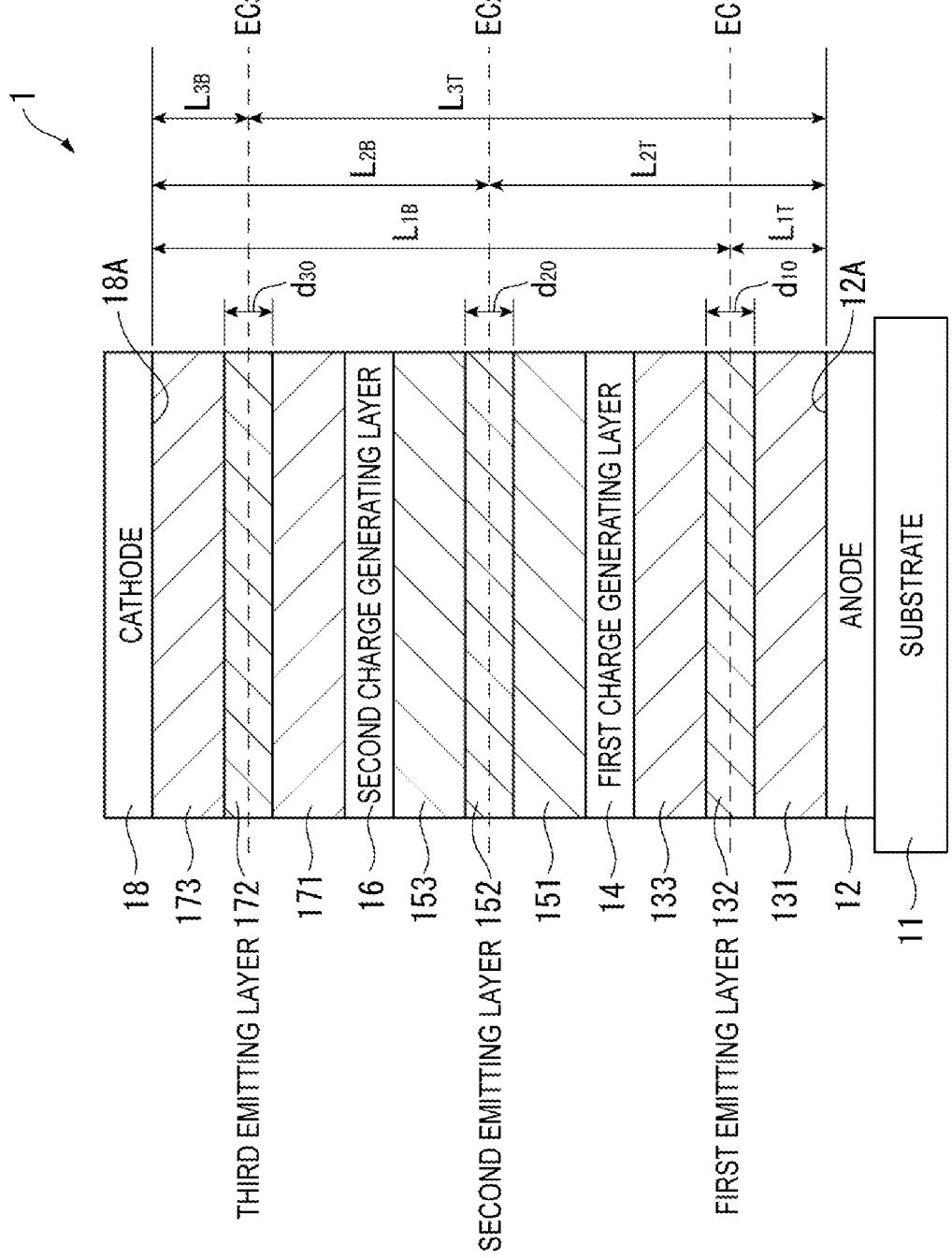
FIG. 2 is an illustration explaining an optical distance between a reflective electrode and a light-emitting center of each of emitting layers in the organic EL device according to the first exemplary embodiment.

Here, $L_1$ to $L_3$ (optical distance: nm) in the numerical formulae (2-1) to (2-3) will be described with reference to FIG. 2. In FIG. 2, $d_{10}$ represents a thickness of the first emitting layer 132, $d_{20}$ represents a thickness of the second emitting layer 152, and $d_{30}$ represents a thickness of the third emitting layer 172.

FIG. 2 is an illustration for explaining the optical distance between the reflective electrode and the light-emitting center of each of the emitting layers in the organic EL device of the first exemplary embodiment.

For instance, when the organic EL device 1 is of a bottom emission type in which light is extracted through the anode 12 and the cathode 18 is a reflective electrode, the optical distance $L_1$ (corresponding to $L_{1B}$ in FIG. 2) in the numerical formula (2-1) means an optical distance between a reflective interface 18A of the cathode 18 (a surface of the cathode 18 close to the first emitting layer) and a light-emitting center ($EC_1$ in FIG. 2) of the first emitting layer 132.

The light-emitting center of the first emitting layer 132 means a surface on which a peak of the light emitting intensity distribution in a thickness direction of the first light emitting layer 132 is located.

Herein, the light-emitting center ($EC_1$ in FIG. 2) of the first emitting layer 132 is defined as a plane that bisects the thickness of the first emitting layer 132.

The optical distance $L_2$ in the numerical formula (2-2) corresponds to $L_{2B}$ in FIG. 2. The optical distance $L_3$ in the numerical formula (2-3) corresponds to $L_{3B}$ in FIG. 2. The light-emitting center of the second emitting layer 152 corresponds to $EC_2$ in FIG. 2. The light-emitting center of the third emitting layer 172 corresponds to $EC_3$ in FIG. 2.

For instance, when the organic EL device 1 is of a top emission type in which light is extracted through the cathode 18 and the anode 12 is a reflective electrode, the optical distance $L_1$ (corresponding to $L_{1T}$ in FIG. 2) in the numerical formula (2-1) means an optical distance between a reflective interface 12A of the anode 12 (a surface of the anode 12 close to the first emitting layer) and a light-emitting center ($EC_1$ in FIG. 2) of the first emitting layer 132.

The optical distance $L_2$ in the numerical formula (2-2) corresponds to $L_{2T}$ in FIG. 2. The optical distance $L_3$ in the numerical formula (2-3) corresponds to $L_{3T}$ in FIG. 2.

The light-emitting center of the first emitting layer 132 corresponds to $EC_1$ in FIG. 2. The light-emitting center of the second emitting layer 152 corresponds to $EC_2$ in FIG. 2. The light-emitting center of the third emitting layer 172 corresponds to $EC_3$ in FIG. 2.

Emission Color

Herein, the blue light emissions refers to light emission in which a main peak wavelength of emission spectrum is in a range from 430 nm to 500 nm.

The yellow light emissions refers to light emission in which a main peak wavelength of emission spectrum is in a range from 530 nm to 600 nm.

The red light emissions refers to light emission in which a main peak wavelength of emission spectrum is in a range from 600 nm to 660 nm.

The green light emissions refers to light emission in which a main peak wavelength of emission spectrum is in a range from 500 nm to 560 nm.

Herein, a "main peak wavelength" meant by a "main peak wavelength of light emission from the "third emitting layer" refers to a value measured as follows.

The same applies to a "main peak wavelength" meant by a "main peak wavelength of light emission from the "second emitting layer" and a "main peak wavelength" meant by a "main peak wavelength of light emission from the "first emitting layer."

A host material and a dopant material to be contained in the emitting layer are co-deposited on a quartz substrate at the same respective ratios as those in the emitting layer of the light emission device to form a 50-nm-thick film on a quartz substrate. An emission spectrum of the film is measured by an excited light with fluorescence spectrophotometer F-7000 (manufactured by Hitachi High-Tech Science Corporation). A peak wavelength of the obtained emission spectrum, at which the luminous intensity of the resultant spectral radiance spectrum is at the maximum, is measured and defined as a main peak wavelength (unit: nm).

Main peak wavelengths of light emissions from a plurality of emitting layers that are laminated are measured in the same manner as above with the fluorescence spectrophotometer F-7000 after each emitting layer is formed to have a 50-nm thickness on a quartz substrate.

In the organic EL device 1 of the exemplary embodiment, the third emitting layer 172 is a blue fluorescent layer containing a blue fluorescent compound.

A main peak wavelength of light emission from the third emitting layer is preferably in a range from 430 nm to 500 nm, more preferably from 440 nm to 470 nm.

In the organic EL device 1 of the exemplary embodiment, the first emitting layer 132 is preferably a blue fluorescent layer.

When the first emitting layer 132 is a blue fluorescent layer, a main peak wavelength of light emission from the first emitting layer is preferably in a range from 430 nm to 500 nm, more preferably from 440 nm to 470 nm.

The first emitting layer 132 may be a fluorescent layer other than a blue fluorescent layer (e.g., a yellow fluorescent layer, red fluorescent layer, and green fluorescent layer), or alternatively, may be a phosphorescent layer in each color (e.g., a blue phosphorescent layer, yellow phosphorescent layer, red phosphorescent layer, and green phosphorescent layer).

In the organic EL device 1 of the exemplary embodiment, the second emitting layer 152 is preferably a blue fluorescent layer.

When the second emitting layer 152 is a blue fluorescent layer, a main peak wavelength of light emission from the second emitting layer 152 is preferably in a range from 430 nm to 500 nm, more preferably from 440 nm to 470 nm.

The second emitting layer 152 may be a fluorescent layer other than a blue fluorescent layer (e.g., a yellow fluorescent layer, red fluorescent layer, green fluorescent layer, and a fluorescent layer including two or more of the yellow, red, and green fluorescent layers), or alternatively, may be a phosphorescent layer in each color (e.g., a blue phosphorescent layer, yellow phosphorescent layer, red phosphorescent layer, green phosphorescent layer, and a phosphorescent layer including two or more of the blue, yellow, red, and green phosphorescent layers).

When the first emitting layer 132 and the third emitting layer 172 are the blue fluorescent layers, the second emitting layer 152 and the third emitting layer 172 are the blue fluorescent layers, or all of the first emitting layer 132, the second emitting layer 152, and the third emitting layer 172 are the blue fluorescent layers, blue fluorescent compounds contained in the blue fluorescent layers may be the same or different and may be of a single kind or two or more kinds.

Embodiments of the emitting layers are preferably as follows.

an embodiment in which the first emitting layer 132 is a yellow phosphorescent layer, the second emitting layer 152 is a blue fluorescent layer, and the third emitting layer 172 is a blue fluorescent layer;

an embodiment in which the first emitting layer 132 is a blue fluorescent layer, the second emitting layer 152 is a yellow phosphorescent layer, and the third emitting layer 172 is a blue fluorescent layer;

an embodiment in which the first emitting layer 132 is a red-yellow phosphorescent layer, the second emitting layer 152 is a blue fluorescent layer, and the third emitting layer 172 is a blue fluorescent layer;

an embodiment in which the first emitting layer 132 is a blue fluorescent layer, the second emitting layer 152 is a red-green phosphorescent layer, and the third emitting layer 172 is a blue fluorescent layer; and an embodiment in which all of the first emitting layer 132, the second emitting layer 152, and the third emitting layer 172 are blue fluorescent layers.

The emitting units and the charge generating layers will be each described in detail. The codes will be omitted in the description below.

First Emitting Unit, Second Emitting Unit, and Third Emitting Unit

The emitting units include the respective emitting layers.

In the following description, the first emitting layer, the second emitting layer, and the third emitting layer when are not distinguished from each other may be simply referred to as "the emitting layer."

The emitting layer may be each independently a single emitting layer or a laminate of a plurality of emitting layers.

Emitting Layer

The emitting layer preferably contains a host material (sometimes referred to as a matrix material) and a dopant material (a luminescent material, guest material or emitter).

Known host materials are used as the host material. Examples of the host material include an amine derivative, azine derivative and fused polycyclic aromatic derivative.

Examples of the amine derivative include a monoamine compound, diamine compound, triamine compound, tetramine compound, and amine compound substituted by a carbazole group.

Examples of the azine derivative are a monoazine derivative, diazine derivative and triazine derivative.

The fused polycyclic aromatic derivative is preferably a fused polycyclic aromatic hydrocarbon not having a heterocyclic skeleton, which is exemplified by a fused polycyclic aromatic hydrocarbon such as naphthalene, anthracene, phenanthrene, chrysene, fluoranthene, and triphenylene, or a derivative of the fused polycyclic aromatic hydrocarbon.

The host material is preferably a derivative of the fused polycyclic aromatic hydrocarbon, more preferably an anthracene derivative, further preferably an anthracene derivative represented by a formula (11) below.

[Formula 1]

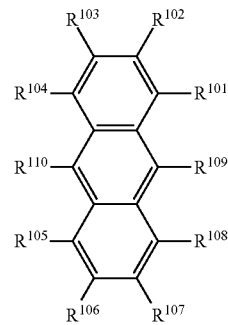

(11)

In the formula (11), $R^{101}$ to $R^{110}$ are each independently a hydrogen atom or a substituent. $R^{101}$ to $R^{110}$ as the substituent are each independently a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted alkylthio group having 1 to 50 carbon atoms, a substituted or unsubstituted aryloxy group having 6 to 30 ring carbon atoms, a substituted or unsubstituted arylthio group having 6 to 30 ring carbon atoms, a substituted or unsubstituted aralkyl group having 7 to 30 carbon atoms, $-Si(R^{121})(R^{122})(R^{123})$, $-C(=O)R^{124}$, $-COOR^{125}$, $-N(R^{126})(R^{127})$, a halogen atom, a cyano group, a nitro group, a substituted or unsubstituted aryl group having 6 to 30 ring carbon atoms, a substituted or unsubstituted heterocyclic group having 5 to 30 ring atoms, or a group represented by -$L^{101}$-$Ar^{101}$.

Among $R^{101}$ to $R^{110}$, two or more adjacent substituents (preferably two or three substituents) may be mutually bonded to form a saturated or unsaturated ring. It is preferable to form at least one (preferably from 1 to 3) saturated or unsaturated ring. The saturated or unsaturated ring is preferably a substituted or unsubstituted five-membered or six-membered ring, more preferably a substituted or unsubstituted benzene ring.

In the formula (11), $R^{121}$ to $R^{127}$ are each independently a hydrogen atom or a substituent. $R^{121}$ to $R^{127}$ as the substituent are each independently a substituted or unsubstituted alkyl group having 1 to 30 carbon atoms, a substituted or unsubstituted aryl group having 6 to 30 ring carbon atoms, or a substituted or unsubstituted heterocyclic group having 5 to 30 ring atoms. However, at least one of $R^{101}$ to $R^{110}$ is a group represented by -$L^{101}$-$Ar^{101}$. $L^{101}$ is a single bond or a linking group. $L^{101}$ as the linking group is a substituted or unsubstituted arylene group having 6 to 30 ring carbon atoms or a substituted or unsubstituted heteroarylene group having 5 to 30 ring atoms. $Ar^{101}$ is a substituted or unsubstituted aryl group having 6 to 30 ring carbon atoms or a substituted or unsubstituted heterocyclic group having 5 to 30 ring atoms.

When two or more $L^{101}$ are present, the two or more $L^{101}$ are mutually the same or different. When two or more $Ar^{101}$ are present, the two or more $Ar^{101}$ are mutually the same or different. When two or more $R^{121}$ are present, the two or more $R^{121}$ are mutually the same or different. When two or more $R^{122}$ are present, the two or more $R^{122}$ are mutually the same or different. When two or more $R^{123}$ are present, the two or more $R^{123}$ are mutually the same or different. When two or more $R^{124}$ are present, the two or more $R^{124}$ are mutually the same or different. When two or more $R^{125}$ are present, the two or more $R^{125}$ are mutually the same or different. When two or more $R^{126}$ are present, the two or more $R^{126}$ are mutually the same or different. When two or more $R^{127}$ are present, the two or more $R^{127}$ are mutually the same or different.

$R^{101}$ to $R^{110}$ in the formula (11) are preferably each independently a hydrogen atom, substituted or unsubstituted alkyl group having 1 to 30 carbon atoms, substituted or unsubstituted aryl group having 6 to 30 ring carbon atoms, substituted or unsubstituted heterocyclic group having 5 to 30 ring atoms, or a group represented by -$L^{101}$-$Ar^{101}$ more preferably a hydrogen atom, substituted or unsubstituted aryl group having 6 to 30 ring carbon atoms, substituted or unsubstituted heterocyclic group having 5 to 30 ring atoms, or a group represented by -$L^{101}$-$Ar^{101}$.

In the formula (11), among $R^{101}$ to $R^{110}$, $R^{109}$ and, $R^{110}$ are preferably each independently a group represented by -$L^{101}$-$Ar^{101}$. At least one of $R^{109}$ and $R^{110}$ is preferably a group represented by -$L^{101}$-$Ar^{101}$.

In the formula (11), when at least one of $R^{101}$ to $R^{110}$ (preferably at least one of $R^{109}$ or $R^{110}$) is a group represented by -$L^{101}$-$Ar^{101}$, and $Ar^{101}$ in the group represented by -$L^{101}$-$Ar^{101}$ is an aryl group, $Ar^{101}$ is preferably a substituted or unsubstituted phenyl group or a substituted or unsubstituted naphthyl group.

In the formula (11), when at least one of $R^{101}$ to $R^{110}$ (preferably at least one of $R^{109}$ or $R^{110}$) is a group represented by -$L^{101}$-$Ar^{101}$, and $Ar^{101}$ in the group represented by -$L^{101}$-$Ar^{101}$ is a heterocyclic group, $Ar^{101}$ is preferably a substituted or unsubstituted dibenzofuranyl group, a substituted or unsubstituted dibenzothienyl group, a substituted or unsubstituted naphthobenzofuranyl group, or a substituted or unsubstituted naphthobenzothienyl group.

Specific examples of the compound represented by the formula (11) are shown below. The host material contained in the emitting layer of the invention is by no means limited to these examples.

[Formula 2]

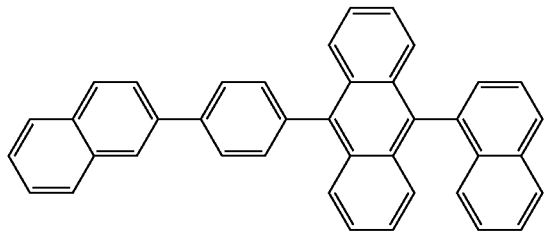

[Formula 3]

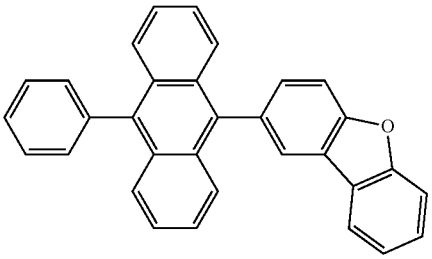

In the exemplary embodiment, when the first emitting layer and the second emitting layer are phosphorescent layers, examples of the host material contained in the phosphorescent layer include a carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styryl anthracene derivative, fluorenone derivative, hydrazone derivative, stilbene derivative, silazane derivative, aromatic tertiary amine compound, styrylamine compound, aromatic dimethylidene compound, porphyrin compound, anthraquinodimethane derivative, anthrone derivative, diphenylquinone derivative, thiopyrandioxide derivative, carbodiimide derivative, fluorenylidenemethan derivative, distyryl pyrazine derivative, tetracarboxylic anhydride (e.g., tetracarboxylic anhydride of naphthaleneperylene), phthalocyanine derivative, various metal complex (e.g., a metal complex of 8-quinolinol derivative, metal phthalocyanine, and a metal complex having benzooxazole or benzothiazole as a ligand), polysilane compound, conductive high-molecular oligomer (e.g., poly(N-vinylcarbazole) derivative, aniline copolymer, thiophene oligomer, and polythiophene), and high polymer compound (e.g., polythiophene derivative, polyphenylene derivative, polyphenylene vinylene derivative, and polyfluorene derivative).

The host material may be used alone or in combination of two or more.

The emitting layer may contain only a single kind of the host material or may contain two or more kinds of the host material.

A content of the host material is not particularly limited. For instance, the content of the host material is preferably in a range from 80 mass % to 99.9 mass %, more preferably from 90 mass % to 99.9 mass %, further preferably from 95 mass % to 99.9 mass %, with respect to the entire emitting layer.

Dopant Material

The emitting layer contains a dopant material. The dopant material is preferably a highly emittable substance and can be exemplified by various materials. For instance, as the dopant material, a fluorescent material that emits fluorescence and a phosphorescent material that emits phosphorescence are usable. The fluorescent material is a compound emittable from a singlet state. The phosphorescent material is a compound emittable from a triplet state.

In the exemplary embodiment, the blue fluorescent layer (the third emitting layer and at least one of the first emitting layer or the second emitting layer) contains a blue fluorescent compound (hereinafter, also referred to as a blue fluorescent material) as the dopant material.

The first emitting layer or the second emitting layer may be an emitting layer other than the blue fluorescent layer. In such a case, the first emitting layer or the second emitting layer may contain a fluorescent material other than a blue fluorescent material or may contain a phosphorescent material in each color.

Examples of the blue fluorescent material include a pyrene derivative, styrylamine derivative, chrysene derivative, fluoranthene derivative, fluorene derivative, monoamine derivative, diamine derivative, and triarylamine derivative.

Examples of a red fluorescent material include a tetracene derivative and a diamine derivative. Examples of a green fluorescent material include an aromatic amine derivative. Examples of a yellow fluorescent material include an anthracene derivative and a fluoranthene derivative.

Examples of a blue phosphorescent material include metal complexes such as an iridium complex, osmium complex and platinum complex. Examples of a green phosphorescent material include an iridium complex. Examples of a red phosphorescent material include metal complexes such as an iridium complex, platinum complex, terbium complex, and europium complex. Examples of a yellow phosphorescent material include an iridium complex.

The blue fluorescent material used for the blue fluorescent layer is preferably a monoamine derivative and a diamine derivative which are represented by a formula (1).

[Formula 4]

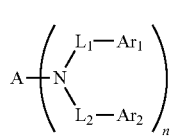

In the formula (1), A represents a substituted or unsubstituted aryl group having 10 to 40 ring carbon atoms, or a substituted or unsubstituted heteroaryl group having 10 to 40 ring carbon atoms.

$L_1$ and $L_2$ each independently represents a single bond, a substituted or unsubstituted aryl group having 6 to 12 ring carbon atoms, or a substituted or unsubstituted heteroaryl group having 5 to 12 ring carbon atoms.

$Ar_1$ and $Ar_2$ each independently represents a substituted or unsubstituted aryl group having 6 to 25 ring carbon atoms, or a substituted or unsubstituted heteroaryl group having 3 to 25 ring carbon atoms.

n is 1 or 2.

Examples of a substituent meant by the above substituted or unsubstituted groups include a substituted or unsubstituted alkyl group having 1 to 20 carbon atoms; a substituted or unsubstituted aryl group having 6 to 25 ring carbon atoms, a substituted or unsubstituted aralkyl group having 7 to 25 ring carbon atoms, a substituted or unsubstituted cycloalkyl group having 3 to 25 ring carbon atoms, a substituted or unsubstituted alkoxyl group having 3 to 20 carbon atoms; a substituted or unsubstituted aryloxy group having 6 to 25 ring carbon atoms, a substituted or unsubstituted arylamino group having 6 to 20 ring carbon atoms, a fluorine atom, a substituted or unsubstituted alkylamino group having 1 to 20 carbon atoms, or a cyano group.

Specific examples of the monoamine derivative and the diamine derivative which are represented by the formula (1) are shown below. The dopant material (the blue fluorescent material) used for the blue fluorescent layer is by no means limited to the specific examples.

[Formula 5]

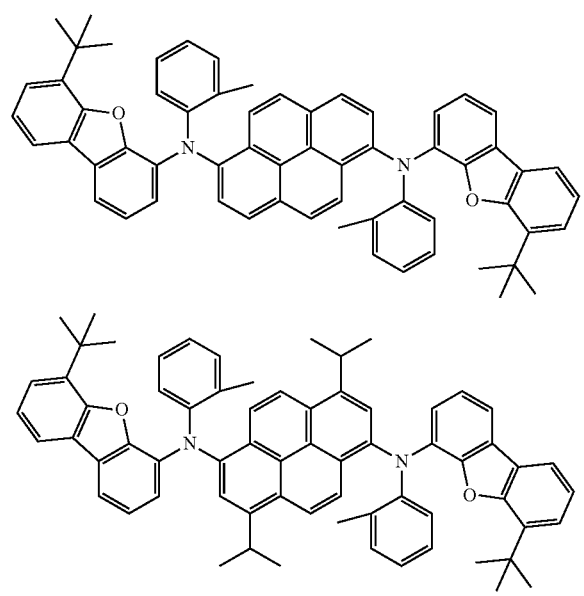

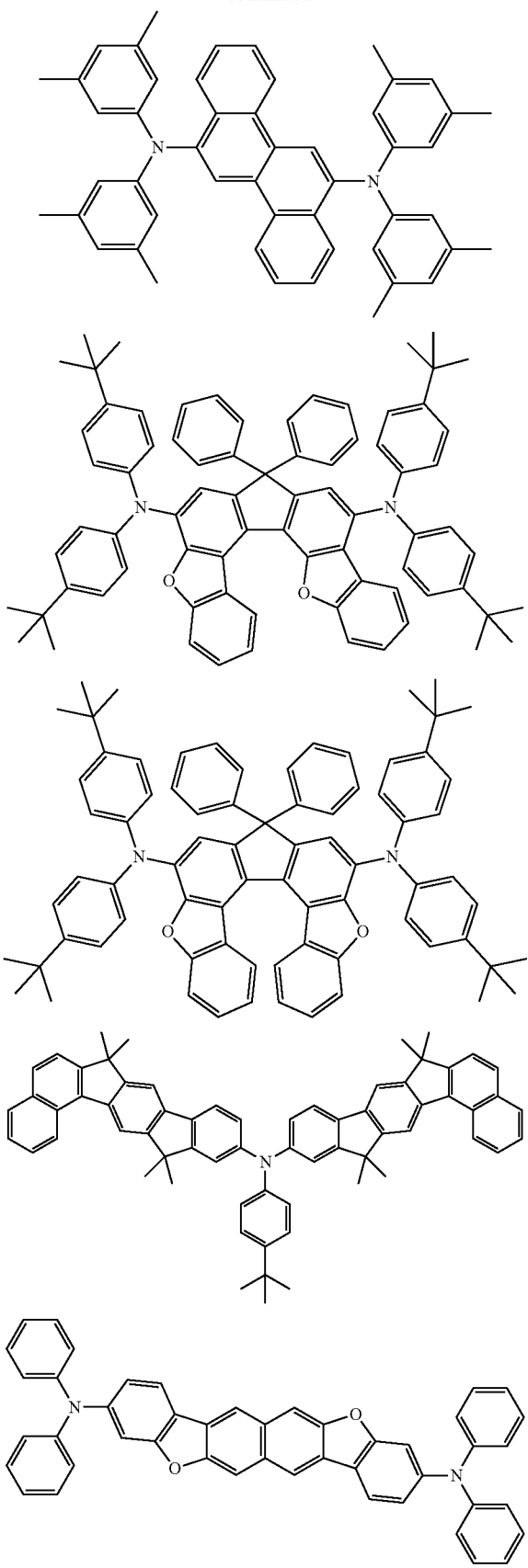

The dopant material (the blue fluorescent material) used for the blue fluorescent layer is also preferably a compound represented by a formula (D2) below.

[Formula 6]

(D2)

In the formula (D2), the ring α, ring β, and the ring γ is each independently selected from the group consisting of a substituted or unsubstituted aromatic hydrocarbon ring having 6 to 30 ring carbon atoms, and a substituted or unsubstituted aromatic hetero ring having 5 to 30 ring atoms.

$R^a$ and $R^b$ are each independently selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 20 carbon atoms.

$R^a$ may be bonded to one or both of the ring α and the ring β directly or through a linking group.

$R^b$ may be bonded to one or both of the ring α and the ring γ directly or through a linking group.

In the formula (D2), the number of the ring carbon atoms of the aromatic hydrocarbon ring is preferably from 6 to 24, more preferably from 6 to 18.

Examples of the aromatic hydrocarbon ring include a benzene ring, biphenyl ring, naphthalene ring, terphenyl ring (m-terphenyl ring, o-terphenyl ring, p-terphenyl ring), anthracene ring, acenaphthylene ring, fluorene ring, phenalene ring, phenanthrene ring, triphenylene ring, fluoranthene ring, pyrene ring, naphthacene ring, perylene ring, and pentacene ring.

In the formula (D2), the number of the ring atoms of the aromatic hetero ring is preferably from 5 to 18, more preferably from 5 to 13.

The aromatic hetero ring includes at least one (preferably from 1 to 5) hetero atom forming a ring. The hetero atom forming the ring is selected from a nitrogen atom, a sulfur atom and an oxygen atom.

Examples of the aromatic hetero ring include a pyrrole ring, oxazole ring, isooxazole ring, thiazole ring, isothiazole ring, imidazole ring, oxadiazole ring, thiadiazole ring, triazole ring, tetrazole ring, pyrazole ring, pyridine ring, pyrimidine ring, pyridazine ring, pyrazine ring, triazine ring, indole ring, isoindole ring, 1H-indazole ring, benzoimidazole ring, benzoxazole ring, benzothiazole ring, 1H-benzotriazole ring, quinolone ring, isoquinoline ring, cinnoline ring, quinazoline ring, quinoxaline ring, phthalazine ring, naphthyridine ring, purine ring, pteridin ring, carbazole ring, acridine ring, phenoxathiin ring, phenoxazinering, phenothiazinering, phenazinering, indolizine ring, furan ring, benzofuran ring, isobenzofuran ring, dibenzofuran ring, thiophene ring, benzothiophene ring, dibenzothiophene ring, furazan ring, oxadiazolering, and thianethrene ring.

In the formula (D2), the ring α, ring β, and ring γ are each independently preferably a five-membered ring or a six-membered ring.

In the formula (D2), a substituent D meant by a "substituted or unsubstituted" group in the ring α, the ring β, and the ring γ is preferably at least one group selected from the group consisting of a substituted or unsubstituted aryl group having 6 to 30 ring carbon atoms; a substituted or unsubstituted heteroaryl group having 5 to 30 ring atoms; a diarylamino group, diheteroarylamino group, or arylheteroarylamino group which is substituted by at least one group selected from the group consisting of a substituted or unsubstituted aryl group having 6 to 30 ring carbon atoms and a substituted or unsubstituted heteroaryl group having 5 to 30 ring atoms; a substituted or unsubstituted alkyl group having 1 to 20 carbon atoms; a substituted or unsubstituted alkoxy group having 1 to 20 carbon atoms; and a substituted or unsubstituted aryloxy group having 6 to 30 carbon atoms.

In the formula (D2), the substituent D meant by a "substituted or unsubstituted" group in the ring α, the ring β, and the ring γ is each independently more preferably at least one group selected from the group consisting of a substituted or unsubstituted aryl group having 6 to 24 ring carbon atoms; a substituted or unsubstituted heteroaryl group having 5 to 18 ring atoms; a diarylamino group, diheteroarylamino group, or arylheteroarylamino group which is substituted by at least one group selected from the group consisting of a substituted or unsubstituted aryl group having 6 to 24 ring carbon atoms and a substituted or unsubstituted heteroaryl group having 5 to 18 ring atoms; a substituted or unsubstituted alkyl group having 1 to 10 carbon atoms; a substituted or unsubstituted alkoxy group having 1 to 10 carbon atoms; and a substituted or unsubstituted aryloxy group having 6 to 24 carbon atoms.

In the formula (D2), the substituent D meant by a "substituted or unsubstituted" group in the ring α, the ring β, and the ring γ is each independently further preferably at least one group selected from the group consisting of a substituted or unsubstituted aryl group having 6 to 18 ring carbon atoms, a substituted or unsubstituted heteroaryl group having 5 to 13 ring atoms, a diarylamino group, diheteroarylamino group, or arylheteroarylamino group which is substituted by at least one group selected from the group consisting of a substituted or unsubstituted aryl group having 6 to 18 ring carbon atoms and a substituted or unsubstituted heteroaryl group having 5 to 13 ring atoms; a substituted or unsubstituted alkyl group having 1 to 6 carbon atoms; a substituted or unsubstituted alkoxy group having 1 to 6 carbon atoms; and a substituted or unsubstituted aryloxy group having 6 to 18 carbon atoms.

When the substituent D further has a substituent E, the substituent E is each independently preferably at least one group selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 20 carbon atoms.

When the substituent D further has the substituent E, the substituent E is each independently more preferably at least one group selected from the group consisting of a substituted or unsubstituted aryl group having 6 to 24 ring carbon atoms, a substituted or unsubstituted heteroaryl group having 5 to 18 ring atoms, and a substituted or unsubstituted alkyl group having 1 to 10 carbon atoms.

When the substituent D further has the substituent E, the substituent E is each independently further preferably at least one group selected from the group consisting of a substituted or unsubstituted aryl group having 6 to 18 ring carbon atoms, a substituted or unsubstituted heteroaryl group having 5 to 13 ring atoms, and a substituted or unsubstituted alkyl group having 1 to 6 carbon atoms.

In the formula (D2), two adjacent substituents on each of the ring α, ring β, and ring γ may form a substituted or unsubstituted aromatic hydrocarbon ring having 6 to 30 ring carbon atoms, or a substituted or unsubstituted aromatic hetero ring having 5 to 30 ring atoms.

In the formula (D2), when two adjacent substituents on each of the ring α, ring β, and ring γ are mutually bonded to form a ring, the formed ring is preferably a substituted or unsubstituted aromatic hydrocarbon ring having 6 to 24 ring carbon atoms, or a substituted or unsubstituted aromatic hetero ring having 5 to 18 ring atoms.

In the formula (D2), when two adjacent substituents D on each of the ring α, ring β, and ring γ are mutually bonded to form a ring, the formed ring is more preferably a substituted or unsubstituted aromatic hydrocarbon ring having 6 to 18 ring carbon atoms, or a substituted or unsubstituted aromatic hetero ring having 5 to 13 ring atoms.

In the formula (D2), a substituent F for the ring formed by mutually bonding two adjacent substituents D on each of the ring α, ring β, and ring γ is exemplified by those of the substituent E. Preferable examples of the substituent F are also the same as those of the substituent E.

In the formula (D2), $R^a$ and $R^b$ are each independently preferably at least one group selected from the group consisting of a substituted or unsubstituted aryl group having 6 to 24 ring carbon atoms, a substituted or unsubstituted heteroaryl group having 5 to 18 ring atoms, and a substituted or unsubstituted alkyl group having 1 to 10 carbon atoms.

In the formula (D2), $R^a$ and $R^b$ are each independently more preferably at least one group selected from the group consisting of a substituted or unsubstituted aryl group having 6 to 18 ring carbon atoms, a substituted or unsubstituted heteroaryl group having 5 to 13 ring atoms, and a substituted or unsubstituted alkyl group having 1 to 6 carbon atoms.

In the formula (D2), the linking group is —O—, —S—, or —$CR^cR^d$—.

$R^c$ and $R^d$ are each independently a hydrogen atom, or a substituted or unsubstituted alkyl group having 1 to 20 carbon atoms.

The substituted or unsubstituted alkyl group having 1 to 20 carbon atoms preferably has 1 to 10 carbon atom, more preferably 1 to 6.

Specific examples of each of the substituents in the formula (D2) are the same as those of the substituent described in "Description of Each Substituent" described later.

As "a substituted or unsubstituted aromatic hydrocarbon ring having 6 to 30 ring carbon atoms" in the formula (D2), an aromatic hydrocarbon ring described in the later-described "Description of Each Substituent" may be used in addition to the above examples of the aromatic hydrocarbon ring.

As "a substituted or unsubstituted aromatic hetero ring having 5 to 30 ring atoms" in the formula (D2), an aromatic hetero ring described in the later-described "Description of Each Substituent" may be used in addition to the above examples of the aromatic hetero ring.

The dopant material (the blue fluorescent material) used for the blue fluorescent layer is also preferably a compound represented by a formula (D3) below.

[Formula 7]

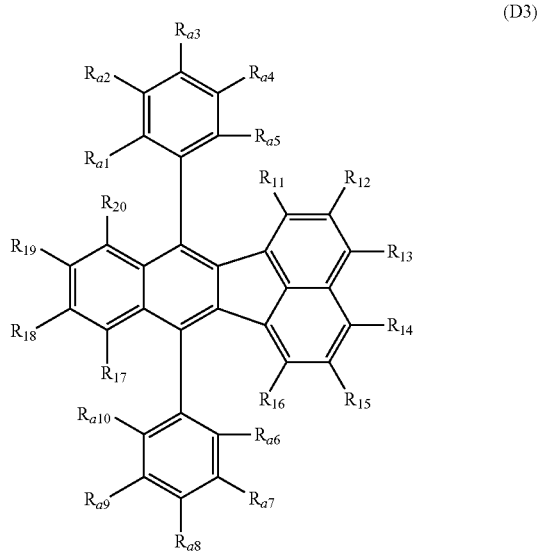

(D3)

In the formula (D3):

$R_{11}$ to $R_{20}$ and $R_{a1}$ to $R_{a10}$ are each independently a hydrogen atom or a substituent. At least one pair of a pair of $R_{11}$ and $R_{12}$, a pair of $R_{12}$ and $R_{13}$, a pair of $R_{13}$ and $R_{14}$, a pair of $R_{14}$ and $R_{15}$, a pair of $R_{15}$ and $R_{16}$, a pair of $R_{17}$ and $R_{18}$, a pair of $R_{18}$ and $R_{19}$, a pair of $R_{19}$ and $R_{20}$, a pair of $R_{a1}$ and $R_{a2}$, a pair of $R_{a2}$ and $R_{a3}$, a pair of $R_{a3}$ and $R_{a4}$, a pair of $R_{a4}$ and $R_{a5}$, a pair of $R_{a6}$ and $R_{a7}$, a pair of $R_{a7}$ and $R_{a8}$, a pair of $R_{a8}$ and $R_{a9}$, or a pair of $R_{a9}$ and $R_{a10}$ are mutually bonded to form a substituted or unsubstituted and saturated or unsaturated ring having 3 to 30 ring atoms.

$R_{11}$ to $R_{20}$ and $R_{a1}$ to $R_{a10}$ as the substituent are each independently selected from the group consisting of a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted alkylthio group having 1 to 30 carbon atoms, a substituted or unsubstituted amino group, a substituted or unsubstituted aryl group having 6 to 30 ring carbon atoms, a substituted or unsubstituted heterocyclic group having 5 to 30 ring atoms, a substituted or unsubstituted alkenyl group having 2 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted phosphino group, a substituted or unsubstituted phosphoryl group, a substituted or unsubstituted silyl group, a substituted or unsubstituted arylcarbonyl group having 6 to 30 ring carbon atoms, a cyano group, a nitro group, a carboxy group, and a halogen atom.

Specific examples of the saturated or unsaturated ring formed by mutually bonding at least one pair of a pair of $R_{11}$ and $R_{12}$, a pair of $R_{12}$ and $R_{13}$, a pair of $R_{13}$ and $R_{14}$, a pair of $R_{14}$ and $R_{15}$, a pair of $R_{15}$ and $R_{16}$, a pair of $R_{17}$ and $R_{18}$, a pair of $R_{18}$ and $R_{19}$, a pair of $R_{19}$ and $R_{20}$, a pair of $R_{a1}$ and $R_{a2}$, a pair of $R_{a2}$ and $R_{a3}$, a pair of $R_{a3}$ and $R_{a4}$, a pair of $R_{a4}$ and $R_{a5}$, a pair of $R_{a6}$ and $R_{a7}$, a pair of $R_{a7}$ and $R_{a8}$, a pair of $R_{a8}$ and $R_{a9}$, or a pair of $R_{a9}$ and $R_{a10}$ in the formula (D3) will be described.

The saturated or unsaturated ring formed in the formula (D3) is exemplified by a partial structure formed by $R_{17}$ to $R_{20}$, which is represented by a formula (D3-1) below. In the partial structure below, a ring is formed by mutually bonding three adjacent substituents, namely, $R_{18}$, $R_{19}$ and $R_{20}$. It should be noted that the partial structure represented by the formula (D3-1) may have a substituent, depending on a type of $R_{18}$, $R_{19}$ and $R_{20}$. * represents a bonding position.

[Formula 8]

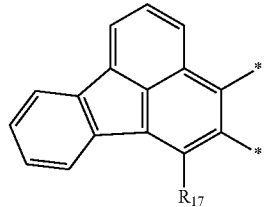

(D3-1)

Moreover, the saturated or unsaturated ring formed in the formula (D3) is exemplified by a partial structure formed by $R_{11}$ to $R_{16}$, which is represented by a formula (D3-2) below. In the partial structure below, two pairs form separate two rings, specifically, by mutually bonding $R_{12}$ and $R_{13}$ and mutually bonding $R_{14}$ and $R_{15}$. It should be noted that the partial structure represented by the formula (D3-2) may have a substituent, depending on a type of $R_{12}$, $R_{13}$, $R_{14}$ and $R_{15}$. * represents a bonding position.

[Formula 9]

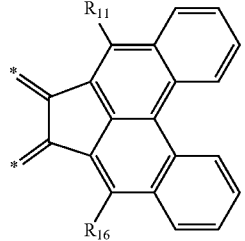

(D3-2)

In an exemplary embodiment, the embodiment of forming the ring is exemplified by an embodiment of forming a substituted or unsubstituted and saturated or unsaturated ring having 3 to 30 ring atoms by mutually bonding $R_{12}$ and $R_{13}$ in the formula (D3) (hereinafter, also referred to as Embodiment A).

It should be noted that the partial structure is not limited to the partial structures represented by the formulae (D3-1) to (D3-2). The embodiment of forming the ring is also not limited to Embodiment A.

The emitting layer may contain only a single kind of the dopant material or may contain two or more kinds of the dopant material.

A content of the dopant material is not particularly limited. The content of the dopant material is, for instance, preferably in a range from 0.1 mass % to 20 mass %, more preferably in a range from 0.1 mass % to 10 mass %, further preferably in a range from 0.1 mass % to 5 mass % with respect to the entire emitting layer.

A thickness (or a total thickness of a plurality of layers) of the first emitting layer is preferably in a range from 5 nm to 100 nm, more preferably from 10 nm to 80 nm, further preferably from 15 nm to 60 nm.

A thickness (or a total thickness of a plurality of layers) of the second emitting layer is preferably in a range from 5 nm to 100 nm, more preferably from 10 nm to 80 nm, further preferably from 15 nm to 60 nm.

A thickness (or a total thickness of a plurality of layers) of the third emitting layer is preferably in a range from 5 nm to 100 nm, more preferably from 10 nm to 80 nm, further preferably from 15 nm to 60 nm.

The emitting layer, the second emitting layer, and the third emitting layer may be mutually the same or different in thickness.

Hole Transporting Zone

Examples of the layer forming the hole transporting zone in each emitting unit include a hole injecting layer and an electron blocking layer in addition to a hole transporting layer.

Hole Transporting Layer

The hole transporting layer is a layer containing a substance exhibiting a high hole transportability (preferably having a hole mobility of $10^{-6}$ $cm^2/[V \cdot s]$ or more). An aromatic amine compound, carbazole derivative, anthracene derivative and the like are usable for the hole transporting layer. Specific examples of the substance usable for the hole transporting layer include an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB).

A carbazole derivative such as CBP, CzPA, and PCzPA and an anthracene derivative such as t-BuDNA, DNA, and DPAnth may be used for the hole transporting layer. Moreover, a polymer compound such as poly(N-vinylcarbazole) (abbreviation: PVK) and poly(4-vinyltriphenylamine) (abbreviation: PVTPA) is also usable for the hole transporting layer.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Hole Injecting Layer

The hole injecting layer is a layer containing a highly hole-injectable substance. Examples of the highly hole-injectable substance include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

Examples of the highly hole-injectable substance further include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1).

A high polymer compound (e.g., oligomer, dendrimer and polymer) is usable as the highly hole-injectable substance. Examples of the high polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid)(PAni/PSS) are also usable.

Electron Transporting Zone

Examples of the layer forming the electron transporting zone in each emitting unit include an electron injecting layer and an hole blocking layer in addition to an electron transporting layer.

Electron Transporting Layer

The electron transporting layer is a layer containing a substance having a high electron transportability (preferably an electron mobility of $10^{-6}$ $cm^2/[V \cdot s]$ or more). For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low molecular organic compound, the metal complex such as Alq, tris(4-methyl-8-quinolinolato)aluminum (abbreviation: Almq3), bis(10-hydroxybenzo[h]quinolinato)beryllium (abbreviation: BeBq$_2$), BAlq, Znq, ZnPBO, and ZnBTZ are usable. In addition to the metal complex, the hetero aromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzooxazole-2-yl)stilbene (abbreviation: BzOs) are usable. It should be noted that any substance other than the above substance may be used for the electron transporting layer as long as the substance exhibits a higher electron transportability than the hole transportability. The electron transporting layer may be not only a single layer but also a laminate of two or more layers formed of the above substance(s).

Moreover, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, a substance containing an alkali metal, alkaline earth metal and a compound thereof in the electron-transporting substance, specifically, a substance containing magnesium (Mg) in Alq may be used for the electron injecting layer. In this case, the electrons can be more efficiently injected from the anode.

Alternatively, the electron injecting layer may be provided by a composite material in a form of a mixture of the organic compound and the electron donor. The composite material exhibits excellent electron injecting performance and electron transporting performance since the electron donor generates electron in the organic compound. In this case, the organic compound is preferably a material excellent in transporting the generated electrons. Specifically, the above examples (e.g., the metal complex and the hetero aromatic compound) of the substance forming the electron transporting layer are usable. The electron donor may be any substance exhibiting an electron donating performance to the organic compound. The electron donor may be any substance exhibiting an electron donating performance to the organic compound, examples of which include lithium, cesium, magnesium, calcium, erbium and ytterbium. The electron donor is also preferably alkali metal oxide and alkaline earth metal oxide such as lithium oxide, calcium oxide, and barium oxide. Further, Lewis base such as magnesium oxide is also usable. Furthermore, tetrathiafulvalene (abbreviation: TTF) is also usable.

When the first emitting unit has the first electron transporting zone, the thickness of the first electron transporting zone (or a total thickness of a plurality of layers forming the first electron transporting zone) is preferably in a range from 0 nm to 200 nm, more preferably from 0 nm to 150 nm, further preferably from 0 nm to 100 nm, further preferably from 5 nm to 100 nm.

When the second emitting unit has the second electron transporting zone, the thickness of the second electron transporting zone (or a total thickness of a plurality of layers forming the second electron transporting zone) is preferably in a range from 0 nm to 200 nm, more preferably from 0 nm to 150 nm, further preferably from 0 nm to 100 nm, further preferably from 5 nm to 100 nm.

When the third emitting unit has the third electron transporting zone, the thickness of the third electron transporting zone (or a total thickness of a plurality of layers forming the third electron transporting zone) is preferably in a range from 0 nm to 200 nm, more preferably from 0 nm to 150 nm, further preferably from 0 nm to 100 nm, further preferably from 5 nm to 100 nm.

First Charge Generating Layer and Second Charge Generating Layer

The first charge generating layer includes a first N layer close to the anode and a first P layer close to the cathode.

The second charge generating layer includes a second N layer close to the anode and a second P layer close to the cathode.

It should be noted that the first charge generating layer may have other layer(s) (e.g., an organic layer, metal layer, and metal oxide layer) between the first N layer and the first P layer. Likewise, the second charge generating layer may also have the above-described other layer(s) between the second N layer and the second P layer.

N Layer

The N layer preferably contains a π electron-deficient compound and an electron donating material.

π Electron-Deficient Compound

The π electron-deficient compound is exemplified by a compound capable of coordinating with a metal atom. Specifically, such a compound is exemplified by a phenanthroline compound, a benzoimidazole compound, and quinolinol.

The phenanthroline compound is preferably compounds represented by respective formulae (I') to (III') below, among which the compounds represented by the formulae (I') and (II') are preferable.

[Formula 10]

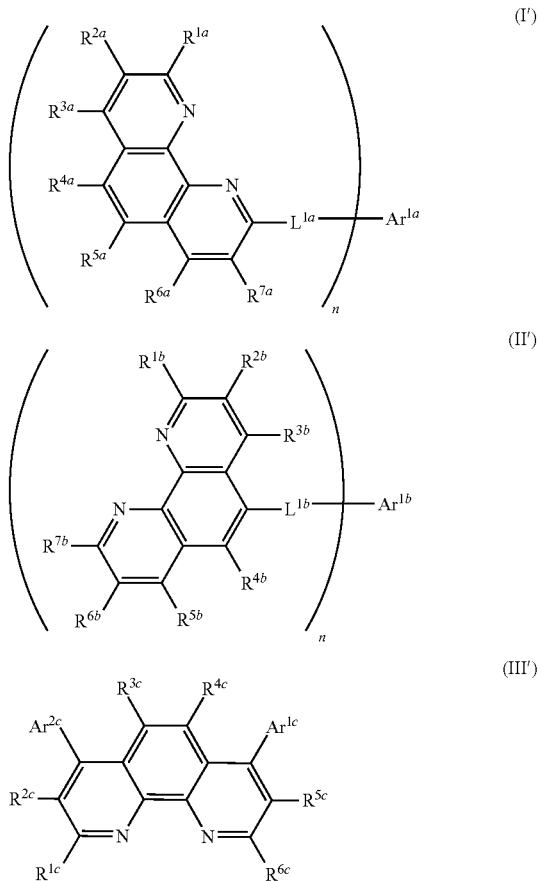

In the formulae (I') to (III'), $R^{1a}$ to $R^{7a}$, $R^{1b}$ to $R^{7b}$, and $R^{1c}$ to $R^{6c}$ are each independently a hydrogen atom, a substituted or unsubstituted aryl group having 6 to 30 ring carbon atoms, a substituted or unsubstituted pyridyl group, a substituted or unsubstituted quinolyl group, a substituted or unsubstituted alkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, an amino group substituted by a substituted or unsubstituted aryl group having 6 to 30 ring carbon atoms, a halogen atom, a cyano group, a nitro group, a hydroxy group, or a carboxy group.

Among $R^{1a}$ to $R^{7a}$, $R^{1b}$ to $R^{7b}$, or $R^{1c}$ to $R^{6c}$, adjacent groups may be bonded to each other to form a ring. Examples of the ring includes a benzene ring, naphthalene ring, pyrazine ring, pyridine ring, and furan ring.

$L^{1a}$ and $L^{1b}$ are each independently a single bond or a linking group. $L^{1a}$ and $L^{1b}$ as the linking group are each independently a substituted or unsubstituted aromatic group having 6 to 20 ring carbon atoms, a substituted or unsubstituted alkylene chain having 1 to 8 carbon atoms, and a substituted or unsubstituted hetero ring. Specifically, a substituted or unsubstituted benzene ring, a substituted or unsubstituted naphthalene ring, a substituted or unsubstituted methylene chain, or a substituted or unsubstituted pyridine ring are preferable.

$Ar^{1a}$, $Ar^{1b}$, $Ar^{1c}$ and $Ar^{2c}$ are each independently a substituted or unsubstituted aromatic group having 6 to 30 ring carbon atoms.

n is in a range from 1 to 4. When n is 2 or more, groups each having a phenanthroline skeleton in parentheses may be the same or different.

Specific examples of the compounds represented by the formulae (I') to (III') are shown below.

[Formula 11]

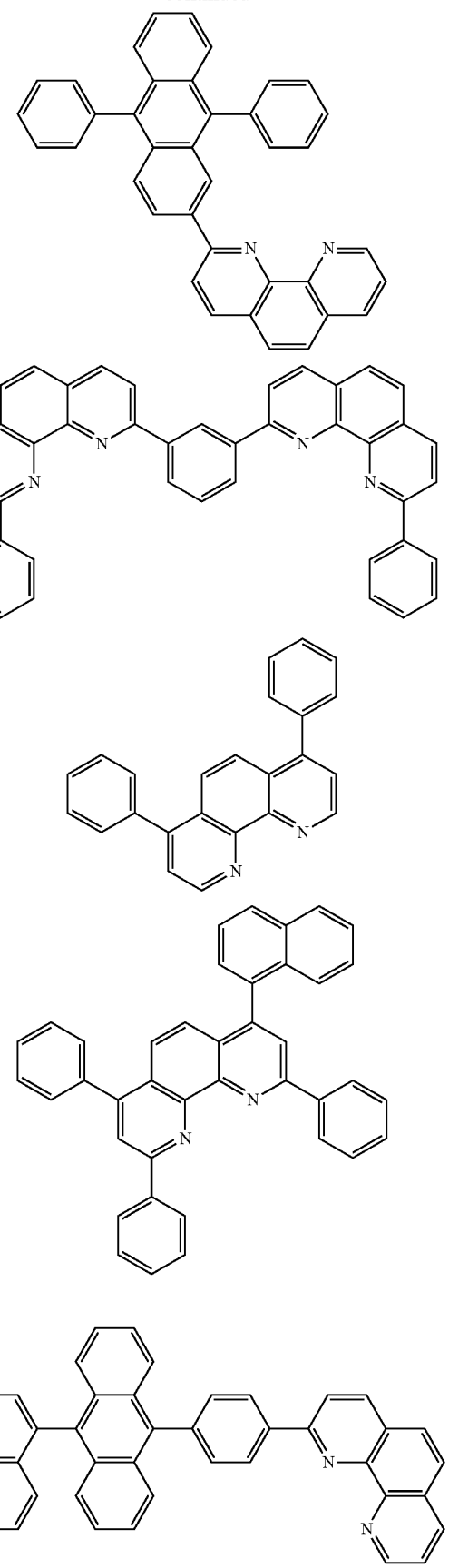

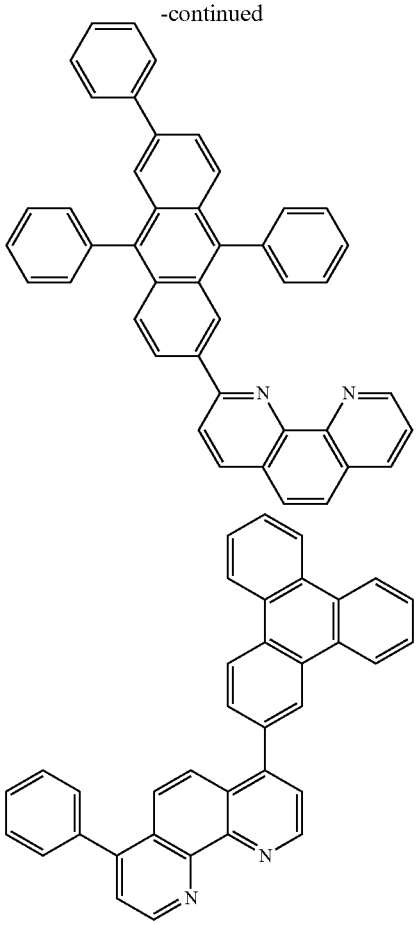

Electron Donating Material

Examples of the electron donating material include an electron donating metal element, metal compound and metal complex. Specifically, the electron donating material is preferably a layer containing at least one of alkali metal, alkali metal compound, organic metal complex containing alkali metal, alkaline earth metal, alkaline earth metal compound, organic metal complex containing alkaline earth metal, rare earth metal, rare earth metal compound, and organic metal complex containing rare earth metal. Among these substances, it is preferable to contain at least one of alkali metal, alkaline earth metal, rare earth metal element, rare earth metal compound and rare earth metal complex.

P Layer

P layer is a layer containing an acceptor material. The P layer may be a layer doped with the acceptor material (i.e., P-doped layer).

when the acceptor material is an organic material, examples of the acceptor material include a compound represented by a formula (I) (indenofluorenedione derivative) and a compound represented by a formula (III).

When the acceptor material is an inorganic material, examples of the acceptor material include molybdenum oxide ($MoO_3$), vanadium oxide ($V_2O_5$), and transparent oxide (e.g., ITO and IZO).

Moreover, the acceptor material can be selected as needed from the "high hole injectable substance" exemplarily listed in the description of the hole injecting layer.

It should be noted that the first hole transporting zone, the second hole transporting zone, and the third hole transporting zone each refer to a zone not containing the acceptor material.

For instance, the compound represented by the formula (I) (i.e., (indenofluorenedione derivative) is usable as the acceptor material.

[Formula 12]

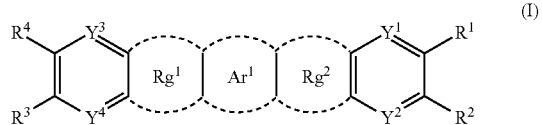

(I)

In the formula (I), $Ar^1$ is an aromatic ring having 6 to 24 carbon atoms or a hetero ring having 5 to 24 ring atoms, preferably an aromatic ring having 6 to 14 carbon atoms or a hetero ring having 5 to 14 ring atoms. Examples of the aromatic ring include a benzene ring, naphthalene ring, fluorene ring, 9,9-dimethylfluorene ring, and 9,9-dioctylfluorene ring. Examples of the hetero ring include a pyrazinering, pyridine ring, quinoxaline ring, thiophene ring, benzothiophene ring, dibenzothiophene ring, furan ring, benzofuran ring, dibenzofuran ring, phenanthroline ring, naphthyridine ring, and tetraazaanthracene ring.

The aromatic ring and hetero ring may be substituted by $R_1$ to $R_4$ described below.

It should be noted that the term "ring carbon atoms" means carbon atoms forming an aromatic ring, and the term "ring atoms" means carbon atom(s) and hetero atom(s) forming a hetero ring (such as a saturated ring, unsaturated ring and aromatic hetero ring).

$Rg^1$ and $Rg^2$ may be mutually the same or different and represented by formula (i) or formula (ii) below.

[Formula 13]

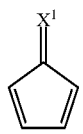

(i)

(ii)

In the formulae (i) and (ii), $X^1$ and $X^2$ may be mutually the same or different, and are each a divalent group represented by one of formulae (a) to (g).

[Formula 14]

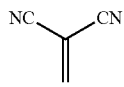

(a)

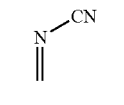

(b)

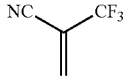

(c)

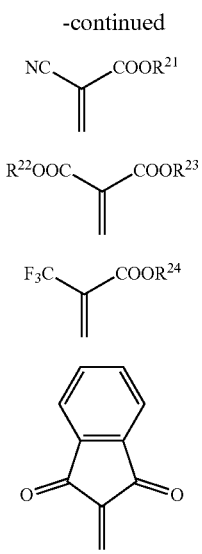

In the formulae (a) to (g), $R^{21}$ to $R^{24}$ may be mutually the same or different, and are each a hydrogen atom, a substituted or unsubstituted fluoroalkyl group, a substituted or unsubstituted alkyl group, a substituted or unsubstituted aryl group, or a substituted or unsubstituted heterocyclic group. $R^{22}$ and $R^{23}$ may be mutually bonded to form a ring.

$Y^1$ to $Y^4$ may be mutually the same or different, and are each —N═, —CH═, or C($R^5$)═. $R^5$ represents the same as $R^1$ to $R^4$ described later. Adjacent ones of $R^1$ to $R^5$ may be mutually bonded to form a ring.

In the formula (I), $R^1$ to $R^4$ may be mutually the same or different, and are each a hydrogen atom, a substituted or unsubstituted alkyl group, a substituted or unsubstituted cycloalkyl group, a substituted or unsubstituted alkenyl group, a substituted or unsubstituted aryl group, a substituted or unsubstituted heterocyclic group, halogen atom, a substituted or unsubstituted fluoroalkyl group, a substituted or unsubstituted alkoxy group, a substituted or unsubstituted fluoroalkoxy group, a substituted or unsubstituted aryloxy group, a substituted or unsubstituted aralkyloxy group, a substituted or unsubstituted amino group, a substituted or unsubstituted silyl group, or a cyano group. $R^1$ and $R^2$ may be mutually bonded to form a ring. $R^3$ and $R^4$ may be mutually bonded to form a ring.

For instance, a compound represented by a formula (III) is usable as the acceptor material used in the P layer.

[Formula 15]

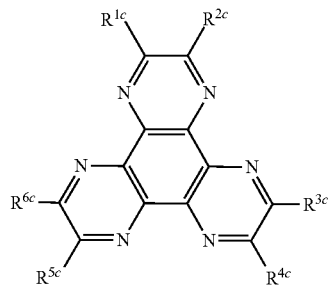

In the formula (III), $R^{1C}$ to $R^{6C}$ are each independently a hydrogen atom, a substituted or unsubstituted aryl group having 6 to 30 ring carbon atoms, a substituted or unsubstituted pyridyl group, a substituted or unsubstituted quinolyl group, a substituted or unsubstituted alkyl group having 1 to 30 carbon atoms, a substituted or unsubstituted cycloalkyl group having 3 to 30 carbon atoms, a substituted or unsubstituted aralkyl group having 7 to 50 ring carbon atoms, a substituted or unsubstituted alkoxy group 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl having 2 to 30 carbon atoms, an amino group substituted by a substituted or unsubstituted aryl group having 6 to 30 ring carbon atoms, halogen atom, a cyano group, a nitro group, a hydroxyl group, or a carboxyl group.

Substrate

The substrate is used as a support for the luminescent device. For instance, glass, quartz, plastics and the like are usable for the substrate. A flexible substrate is also usable. The flexible substrate means a substrate that can be bent. Examples of the flexible substrate include a plastic substrate made of polycarbonate, polyarylate, polyethersulfone, polypropylene, polyester, polyvinyl fluoride, and polyvinyl chloride. Moreover, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), nitrides of a metal material (e.g., titanium nitride) and the like are usable.

The above materials are typically formed into a film by sputtering. For instance, indium oxide-zinc oxide can be formed by the sputtering method using a target containing zinc oxide in a range from 1 wt % to 10 wt % relative to indium oxide. The indium oxide containing tungsten oxide and zinc oxide can be formed by the sputtering method using a target in which tungsten oxide in a range from 0.5 wt % to 5 wt % and zinc oxide in a range from 0.1 wt % to 1 wt % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

The elements belonging to the group 1 or 2 of the periodic table, which are a material having a small work function, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal are usable. It should be noted that the vacuum deposition method and the sputtering method are usable for forming the anode using the alkali metal, alkaline earth metal and the alloy thereof. Further, when the anode 3 is formed of silver paste and the like, coating, ink jet printing and the like are usable.

When the organic EL device is of a bottom emission type, the anode is preferably formed of a light-transmissive or semi-transmissive metallic material that transmits light from the emitting layer. Herein, the light-transmissive or semi-transmissive property means the property of allowing transmissivity of 50% or more (preferably 80% or more) of the light emitted from the emitting layer. The light-transmissive or semi-transmissive metallic material can be selected in use as needed from the above materials listed in the description about the anode.

When the organic EL device is of a top emission type, the anode is a reflective electrode having a reflective layer. The reflective layer is preferably formed of a metallic material having light reflectivity. Herein, the light reflectivity means the property of reflecting 50% or more (preferably 80% or more) of the light emitted from the emitting layer. The metallic material having light reflectivity can be selected in use as needed from the above materials listed in the description about the anode.

The anode may be formed only of the reflective layer, but may be a multilayer structure having the reflective layer and a conductive layer (preferably a transparent conductive layer). When the anode has the reflective layer and the conductive layer, it is preferable that the conductive layer is disposed between the reflective layer and the hole transporting zone. A material of the conductive layer can be selected in use as needed from the above materials listed in the description about the anode.

Cathode

It is preferable to use metal, an alloy, an electroconductive compound, and a mixture thereof, which have a small work function (specifically, 3.8 eV or less) for the cathode. Examples of materials for the cathode include elements belonging to the group 1 or 2 of the periodic table, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal.

It should be noted that the vacuum deposition method and the sputtering method are usable for forming the cathode using the alkali metal, alkaline earth metal and the alloy thereof. Further, when the cathode 4 is formed of silver paste and the like, coating, ink jet printing and the like are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film by sputtering, ink jet printing, spin coating and the like.

When the organic EL device is of a bottom emission type, the cathode is a reflective electrode having a reflective layer. The reflective layer is preferably formed of a metallic material having light reflectivity. The metallic material having light reflectivity can be selected in use as needed from the above materials listed in the description about the cathode.

When the organic EL device is of a top emission type, the cathode is preferably formed of a light-transmissive or semi-transmissive metallic material that transmits light from the emitting layer. The light-transmissive or semi-transmissive metallic material can be selected in use as needed from the above materials listed in the description about the cathode.

Capping Layer

The top emission type organic EL device usually has a capping layer on the top of the cathode.

As the capping layer, for example, a high polymer compound, metal oxide, metal fluoride, metal boride, silicon nitride, silicon compound (silicon oxide or the like), and the like can be used.

In addition, an aromatic amine derivative, an anthracene derivative, a pyrene derivative, a fluorene derivative, or a dibenzofuran derivative can also be used for the capping layer.

Moreover, a laminate obtained by laminating layers containing these substances is also usable as a capping layer.

Layer Thickness

In an organic EL device, a layer thickness of each of the emitting layer and the like provided between the anode and the cathode is not limited except for the above particular definition. In general, the layer thickness preferably ranges from several nanometers to 1 µm in order to avoid defects such as a pin hole and to prevent efficiency from being deteriorated since a high voltage needs to be applied in the case of extreme thickness.

Manufacturing Method of Organic EL Device

A manufacturing method of an organic EL device is not particularly limited. A typical manufacturing method used for an organic EL device is usable. Specific examples for forming the respective layers on the substrate are vacuum deposition, a casting method, a coating method and a spin coating method.

Moreover, in addition to the casting method, the coating method and the spin coating using a solution, in which the organic material of the layers are dispersed, on a transparent polymer such as polycarbonate, polyurethane, polystyrene, polyarylate and polyester, the respective layers can be formed by simultaneous deposition with the organic material and the transparent polymer.

Second Exemplary Embodiment

An organic EL device according to a second exemplary embodiment is an organic EL device in which a hole transporting zone (third hole transporting zone) of the third emitting unit among the emitting units includes two or more hole transporting layers. Since the organic EL device is otherwise the same as the organic EL device in the first exemplary embodiment, the description of the same features is omitted or simplified.

It is considered that holes are efficiently injected from the second charge generating layer since the third hole transporting zone includes two or more hole transporting layers in the organic EL device according to the second exemplary embodiment.

Here, the hole transporting layer is sometimes referred to as an electron blocking layer since the hole transporting layer sometimes has an electron blocking function.

A material contained in the hole transporting layer usually has resistance to excitons. Accordingly, by disposing two or more hole transporting layers in the third hole transporting zone, deterioration of an interface between the hole transporting layer and the third emitting layer can be reduced. With this configuration, a lifetime of the organic EL device is likely to be more improved.

Further, since the material contained in the hole transporting layer usually has a larger energy gap than the host material (e.g., a compound BH used in Examples) contained in the third emitting layer, by disposing two or more hole transporting layers in the third hole transporting zone, emission energy of the third emitting layer can be effectively trapped to reduce inactivation of the emission energy. With this configuration, a luminous efficiency is easily improvable.

Accordingly, in the organic EL device of the second exemplary embodiment, the drive voltage is reducible and the lifetime is improvable. Further, an improvement in the luminous efficiency (preferably a luminous efficiency of blue fluorescence) is also expected.

In order to more express effects of the exemplary embodiment, the hole transporting zone (third hole transporting zone) in the third emitting unit preferably includes two or more layers (preferably from two layers to four layers), more preferably two layers. Specifically, more preferably, the hole transporting zone in the third emitting unit includes two hole transporting layers.

In order to more express effects of the exemplary embodiment, the hole transporting zone (second hole transporting zone) in the second emitting unit preferably includes two or more layers (preferably from two layers to four layers), more preferably two layers. Specifically, more preferably, the hole transporting zone in the second emitting unit includes two hole transporting layers.

The hole transporting zone (first hole transporting zone) in the first emitting unit preferably includes three or more layers (preferably from three layers to five layers), more preferably three layers. Specifically, the hole transporting zone in the first emitting unit preferably includes one hole injecting layer adjacent to the anode and two hole transporting layers laminated on the hole injecting layer.

Figure 3:
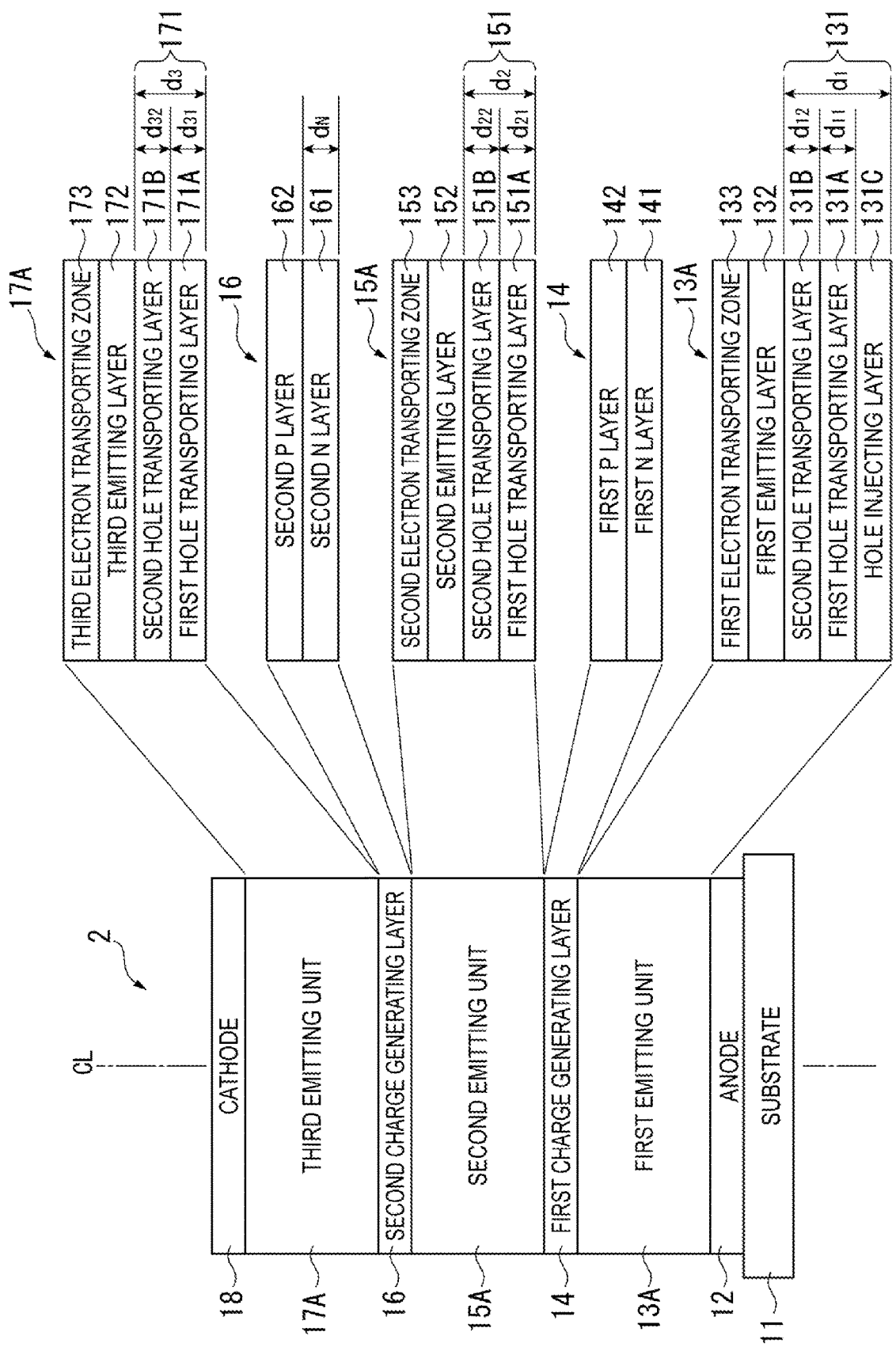
FIG. 3 schematically shows an exemplary arrangement of an organic EL device according to a second exemplary embodiment.

FIG. 3 schematically shows an exemplary arrangement of the organic EL device according to the second exemplary embodiment.

The organic EL device shown in FIG. 3 is provided by including two hole transporting layers in each of the third hole transporting zone and the second hole transporting zone to the organic EL device 1 shown in FIG. 1. The organic EL device according to the second exemplary embodiment is different from the organic EL device according to the first exemplary embodiment in that the first hole transporting zone includes one hole injecting layer and two hole transporting layers.

Specifically, an organic EL device 2 includes the anode 12, a first emitting unit 13A, the first charge generating layer 14, a second emitting unit 15A, the second charge generating layer 16, a third emitting unit 17A, and the cathode 18, which are laminated on the substrate 11 in this order.

A thickness $d_3$ (a total of $d_{31}$ and $d_{32}$) of the third hole transporting zone 171 is in a range from 10 nm to 30 nm and is thinner than a thickness $d_N$ of the second N layer 161.

The third hole transporting zone 171 includes a first hole transporting layer 171A and a second hole transporting layer 171B in this order from the anode. The first hole transporting layer 171A is adjacent to the P layer 162 of the second charge generating layer 16.

The second hole transporting zone 151 includes a first hole transporting layer 151A and a second hole transporting layer 151B in this order from the anode. The first hole transporting layer 151A is adjacent to the P layer 142 of the first charge generating layer 14.

The first hole transporting zone 131 includes a hole injecting layer 131C, a first hole transporting layer 131A, and a second hole transporting layer 131B laminated in this order from the anode. The hole injecting layer 131C is adjacent to the anode 12.

The thickness ($d_{11}$, $d_{21}$ and $d_{31}$ in FIG. 3) of the first hole transporting layer of each hole transporting zone is each independently preferably in a range from 2 nm to 38 nm, more preferably from 5 nm to 25 nm, further preferably from 5 nm to 15 nm.

The thickness ($d_{12}$, $d_{22}$ and $d_{32}$ in FIG. 3) of the second hole transporting layer of each hole transporting zone is each independently preferably in a range from 2 nm to 38 nm, more preferably from 5 nm to 25 nm, further preferably from 5 nm to 15 nm.

A ratio of the thickness ($d_{12}/d_{ig}$, $d_{22}/d_{21}$, and $d_{32}/d_{31}$ in FIG. 3) of the second hole transporting layer to the thickness of the first hole transporting layer in each hole transporting zone is each independently preferably in a range from 0.05 to 19, more preferably from 0.2 to 5, further preferably from 0.3 to 3.

Third Exemplary Embodiment

Electronic Device

An electronic device of a third exemplary embodiment is installed with the organic EL device according to the first or second exemplary embodiment. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Since the according to the third exemplary embodiment is installed with the organic EL device according to the first or second exemplary embodiment, the drive voltage is reducible and the lifetime is improvable.

Herein, numerical ranges represented by "x to y" represents a range whose lower limit is the value (x) recited before "to" and whose upper limit is the value (y) recited after "to".

Herein, the phrase "Rx and Ry are mutually bonded to form a ring" means, for instance, that Rx and Ry include a carbon atom, a nitrogen atom, an oxygen atom, a sulfur atom or a silicon atom, the atom(s) contained in Rx (a carbon atom, a nitrogen atom, an oxygen atom, a sulfur atom or a silicon atom) and the atom(s) contained in Ry (a carbon atom, a nitrogen atom, an oxygen atom, a sulfur atom or a silicon atom) are bonded via a single bond(s), a double bond(s), a triple bond, and/or a divalent linking group(s) to form a ring having 5 or more ring carbon atoms (specifically, a heterocycle or an aromatic hydrocarbon ring). x represents a number, a character or a combination of a number and a character. y represents a number, a character or a combination of a number and a character.

The divalent linking group is not limited. Examples of the divalent linking group include —O—, —CO—, —CO$_2$—, —S—, —SO—, —SO$_2$—, —NH—, —NRa—, and a group provided by a combination of two or more of these linking group.

Specific examples of the heterocycle include a cyclic structure (heterocycle) provided by removing a bond from the "heteroaryl group having 5 to 30 ring atoms" exemplified in later-described "Description of Substituents in Formula." The hetero ring may have a substituent.

Specific examples of the aromatic hydrocarbon ring include a cyclic structure (aromatic hydrocarbon ring) provided by removing a bond from the "aryl group having 6 to 30 ring carbon atoms" exemplified in later-described "Description of Substituents in Formula." The aromatic hydrocarbon ring may have a substituent.

Examples of Ra include a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms.

For instance, when "Rx and Ry are mutually bonded to form a ring," an atom(s) contained in $Rx_1$ and an atom(s) contained in $Ry_1$ in a molecular structure represented by a formula (E1) below form a ring (cyclic structure) E represented by a formula (E2); an atom(s) contained in $Rx_1$ and an atom(s) contained in $Ry_1$ in a molecular structure represented by a formula (F1) below form a ring (cyclic structure) F represented by a formula (F2); an atom(s) contained in $Rx_1$ and an atom(s) contained in $Ry_1$ in a molecular structure represented by a formula (G1) below form a ring (cyclic structure) G represented by a formula (G2); an atom(s) contained in $Rx_1$ and an atom(s) contained in $Ry_1$ in a molecular structure represented by a formula (H1) below form a ring (cyclic structure) H represented by a formula (H2); or an atom(s) contained in $Rx_1$ and an atom(s) contained in $Ry_1$ in a molecular structure represented by a formula (I1) below form a ring (cyclic structure) I represented by a formula (I2).

In the formulae (E1) to (I1), * each independently represent a bonding position to another atom in a molecule. The two * in the formulae (E1), (F1), (G1), (H1) and (I1) correspond to two * in the formula (E2), (F2), (G2), (H2) and (I2), respectively.

[Formula 16]

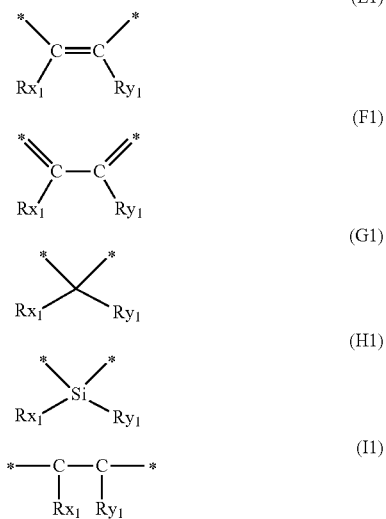

[Formula 17]

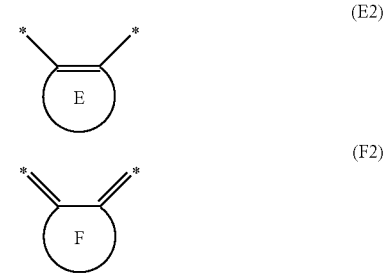

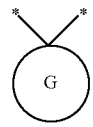

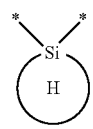

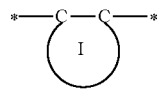

In the molecular structures represented by the formulae (E2) to (I2), E to I each represent a cyclic structure (the ring having 5 or more ring atoms). In the formulae (E2) to (I2), * each independently represent a bonding position to another atom in a molecule. The two * in the formula (E2) correspond to two * in the formula (E1). Similarly, two * in each of the formulae (F2) to (I2) correspond one-to-one to two * in in each of the formulae (F1) to (I1).

For instance, in the formula (E1), $Rx_1$ and $Ry_1$ are mutually bonded to form the ring E in the formula (E2) and the ring E is an unsubstituted benzene ring, the molecular structure represented by the formula (E1) is a molecular structure represented by a formula (E3) below. Herein, two * in the formula (E3) each independently correspond to two * in the formula (E2) and the formula (E1).

For instance, in the formula (E1), $Rx_1$ and $Ry_1$ are mutually bonded to form the ring E in the formula (E2) and the ring E is an unsubstituted pyrrole ring, the molecular structure represented by the formula (E1) is a molecular structure represented by a formula (E4) below. Herein, two * in the formula (E4) each independently correspond to two * in the formula (E2) and the formula (E1). In the formulae (E3) and (E4), * each independently represent a bonding position to another atom in a molecule.

[Formula 18]

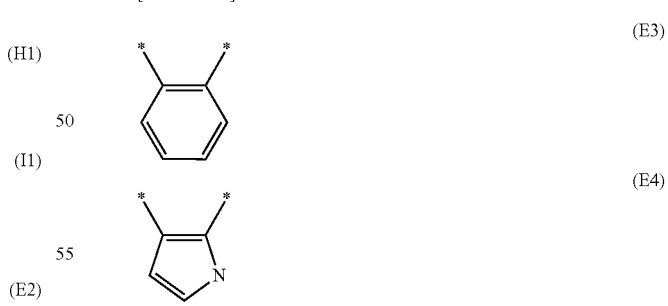

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, the "ring carbon atoms" do not include carbon(s) contained in the substituent. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. For instance, a benzene ring has 6 ring carbon atoms, a naphthalene ring has 10 ring carbon atoms, a pyridinyl group has 5 ring carbon atoms, and a furanyl group has 4 ring carbon atoms. When a fluorene ring is substituted by, for instance, a fluorene ring (e.g., a spirofluorene ring), the number of carbon atoms of the fluorene ring as a substituent is not counted in the number of the ring carbon atoms for the fluorene ring.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring and atom(s) included in the substituent substituting the ring are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to the pyridine ring and the quinazoline ring and atoms forming the substituents are not counted in the number of the ring atoms. When a fluorene ring is substituted by a substituent (e.g., a fluorene ring) (i.e., a spirofluorene ring is included), the number of atoms of the fluorene ring as the substituent is not counted in the number of the ring atoms of the fluorene ring.

Description of Each Substituent in Formula Herein

Herein, examples of an aryl group (occasionally referred to as an aromatic hydrocarbon group) having 6 to 30 ring carbon atoms include a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms described herein below.

The heteroaryl group (occasionally, referred to as a heterocyclic group, heteroaromatic ring group or aromatic heterocyclic group) having 5 to 30 ring atoms herein preferably contains as a hetero atom at least one atom selected from the group consisting of nitrogen, sulfur, oxygen, silicon, selenium atom and germanium atom, and more preferably contains at least one atom selected from the group consisting of nitrogen, sulfur and oxygen.

Herein, examples of the heterocyclic group having 5 to 30 ring atoms include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

Herein, the heterocyclic group preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further preferable. In 1-carbazolyl group, 2-carbazolyl group, 3-carbazolyl group and 4-carbazolyl group, a nitrogen atom at the ninth position is preferably substituted by a substituted or unsubstituted aryl group having 6 to 30 ring carbon atoms or a substituted or unsubstituted heterocyclic group having 5 to 30 ring atoms herein.

Herein, the heterocyclic group may be a group derived from any one of partial structures represented by formulae (XY-1) to (XY-18).

[Formula 19]

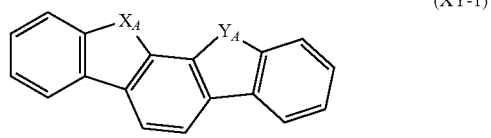

(XY-1)

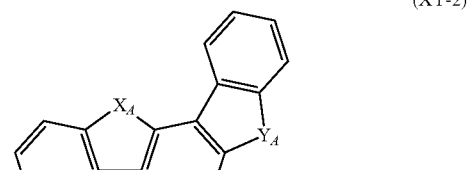

(XY-2)

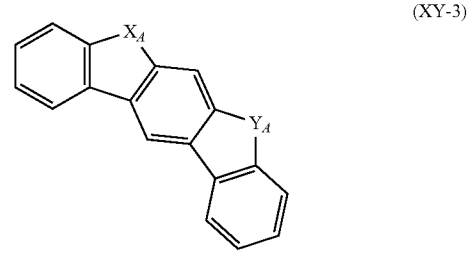

(XY-3)

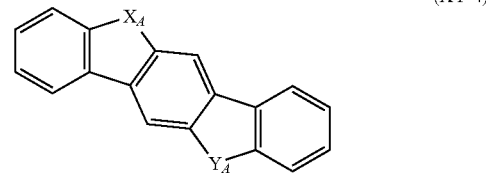

(XY-4)

[Formula 20]

(XY-5) 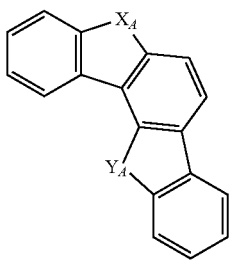

(XY-6) 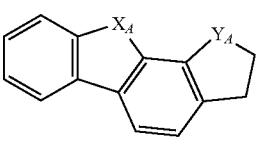

(XY-7) 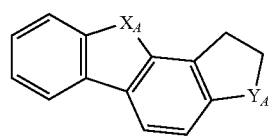

(XY-8) 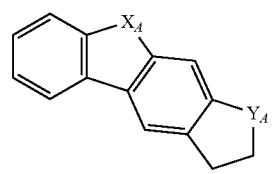

(XY-9) 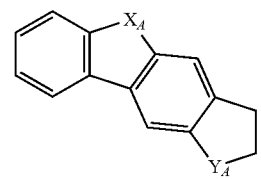

(XY-10) 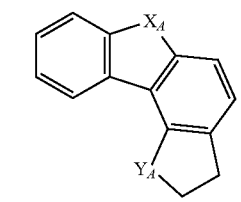

(XY-11) 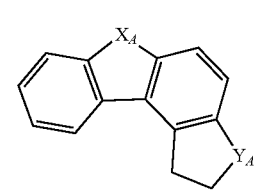

(XY-12)

[Formula 21]

(XY-13) 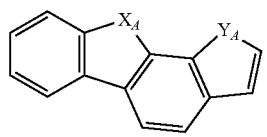

(XY-14) 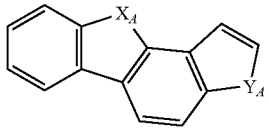

(XY-15) 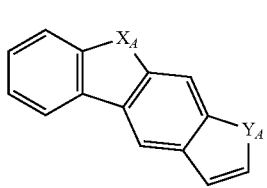

(XY-16) 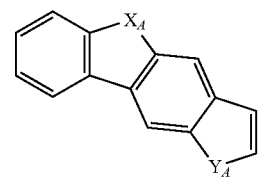

(XY-17) 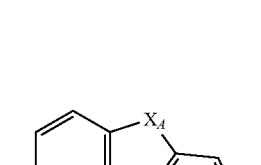

(XY-18) 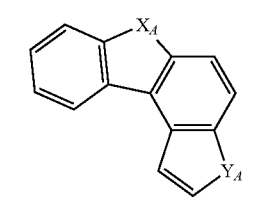

In the formulae (XY-1) to (XY-18), $X_A$ and $Y_A$ each independently represent a hetero atom, and preferably represent an oxygen atom, sulfur atom, selenium atom, silicon atom or germanium atom. The partial structures represented by the formulae (XY-1) to (XY-18) may each have a bond(s) in any position to become a heterocyclic group, in which the heterocyclic group may be substituted.

Examples of a substituted or unsubstituted carbazolyl group herein may contain groups represented by formulae (XY-19) to (XY-22) in which a further group is fused to a carbazole ring. Such a group may be substituted. The group may be bonded in any position as desired.

[Formula 22]

(XY-19)
(XY-20)
(XY-21)
(XY-22)

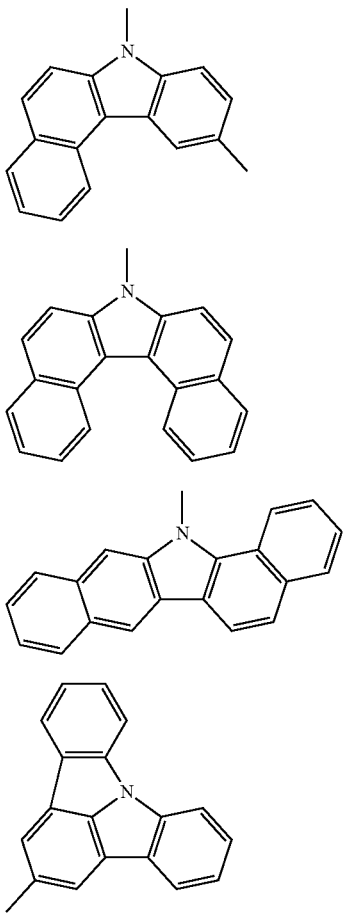

The alkyl group having 1 to 30 carbon atoms herein may be linear, branched or cyclic. Also, the alkyl group may be a halogenated alkyl group.

Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear or branched alkyl group preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are further more preferable.

Herein, the cyclic alkyl group is exemplified by a cycloalkyl group having 3 to 30 ring carbon atoms.

Herein, examples of the cycloalkyl group having 3 to 30 ring carbon atoms include a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are further more preferable.

Herein, the alkyl halide group provided by substituting the alkyl group with a halogen atom is exemplified by an alkyl halide group provided by substituting the alkyl group having 1 to 30 carbon atoms with at least one halogen atom, preferably at least one fluorine atom.

Herein, examples of the alkyl halide group having 1 to 30 carbon atoms include a fluoromethyl group, difluoromethyl group, trifluoromethyl group, fluoroethyl group, trifluoromethylmethyl group, trifluoroethyl group, and pentafluoroethyl group.

Herein, examples of the substituted silyl group include an alkylsilyl group having 3 to 30 carbon atoms and an arylsilyl group having 6 to 30 ring carbon atoms.

Herein, the alkylsilyl group having 3 to 30 carbon atoms is exemplified by a trialkylsilyl group having the above examples of the alkyl group having 1 to 30 carbon atoms. Specific examples of the alkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be mutually the same or different.

Herein, examples of the arylsilyl group having 6 to 30 ring carbon atoms include a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

Herein, an alkylsulfonyl group is represented by —SO$_2$R$_w$. R$_w$ in —SO$_2$R$_w$ is represented by a substituted or unsubstituted alkyl group.

Herein, examples of the substituted or unsubstituted alkylsulfonyl having 1 to 30 carbon atoms include a group represented by the above —SO$_2$R$_w$, where R$_w$ is the above substituted or unsubstituted alkyl group having 1 to 30 carbon atoms.

Herein, an aryl group included in an aralkyl group (occasionally referred to as an arylalkyl group) is an aromatic hydrocarbon group or a heterocyclic group.

Herein, an aralkyl group having 7 to 30 carbon atoms is preferably an aralkyl group having an aryl group having 6 to 30 ring carbon atoms and is represented by —Z$_3$-Z$_4$. Z$_3$ is exemplified by an alkylene group derived from the above alkyl group having 1 to 30 carbon atoms. Z$_4$ is exemplified by the above aryl group having 6 to 30 ring carbon atoms. In the aralkyl group, an aryl moiety has 6 to 30 carbon atoms, preferably 6 to 20 carbon atoms, more preferably 6 to 12 carbon atoms, and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Herein, the alkoxy group having 1 to 30 carbon atoms is represented by —$OZ_1$. $Z_1$ is exemplified by the above alkyl group having 1 to 30 carbon atoms. Examples of the alkoxy group include a methoxy group, ethoxy group, propoxy group, butoxy group, pentyloxy group and hexyloxy group. The alkoxy group preferably has 1 to 20 carbon atoms.

A halogenated alkoxy group provided by substituting the alkoxy group with a halogen atom is exemplified by a halogenated alkoxy group provided by substituting the alkoxy group having 1 to 30 carbon atoms with one or more fluorine groups.

Herein, an aryl group in an aryloxy group (sometimes referred to as an arylalkoxy group) also includes a heteroaryl group.

Herein, an arylalkoxy group having 6 to 30 ring carbon atoms is represented by —$OZ_2$. $Z_4$ is exemplified by the above aryl group having 6 to 30 ring carbon atoms. The arylalkoxy group preferably has 6 to 20 ring carbon atoms. The arylalkoxy group is exemplified by a phenoxy group.

Herein, a substituted amino group is represented by —$NHR_V$ or —$N(R_V)_2$. Examples of $R_V$ include the above alkyl group having 1 to 30 carbon atoms and the above aryl group having 6 to 30 ring carbon atoms.

Herein, an alkenyl group having 2 to 30 carbon atoms is linear or branched. Examples of the alkenyl group having 2 to 30 carbon atoms include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

Herein, an alkynyl group having 2 to 30 carbon atoms may be linear or branched. Examples of the alkynyl group having 2 to 30 carbon atom include ethynyl, propynyl, and 2-phenylethynyl.

Herein, an alkylthio group having 1 to 30 carbon atoms and an arylthio group having 6 to 30 ring carbon atoms are represented by —$SR_V$. Examples of $R_V$ include the above alkyl group having 1 to 30 carbon atoms and the above aryl group having 6 to 30 ring carbon atoms. The alkylthio group preferably has 1 to 20 carbon atoms. The arylthio group preferably has 6 to 20 ring carbon atoms.

Examples of the halogen atom herein include a fluorine atom, chlorine atom, bromine atom and iodine atom, among which a fluorine atom is preferable.

Herein, examples of a substituted phosphino group include a phenyl phosphanyl group.

Herein, the arylcarbonyl group having 6 to 30 ring carbon atoms is represented by —COY'. Y' is exemplified by the above "aryl group having 6 to 30 ring carbon atoms."

Herein, examples of the arylcarbonyl group having 6 to 30 ring carbon atoms include a phenyl carbonyl group, diphenyl carbonyl group, naphthyl carbonyl group, and triphenyl carbonyl group.

The acyl group having 2 to 31 carbon atoms herein is represented by —COR'. R' is exemplified by the above alkyl group having 1 to 30 carbon atoms. Herein, the acyl group having 2 to 31 carbon atoms is exemplified by an acetyl group and a propionyl group.

A substituted phosphoryl group herein is represented by a formula (P).

[Formula 23]

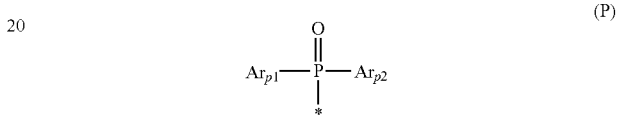

(P)

In the formula (P), examples of $Ar_{P1}$ and $Ar_{P2}$ include a substituent selected from the group consisting of an alkyl group having 1 to 30 (preferably 1 to 10, more preferably 1 to 6) carbon atoms, and an aryl group having 6 to 30 (preferably 6 to 20, more preferably 6 to 14) ring carbon atoms. The alkyl group having 1 to 30 carbon atoms is exemplified by the above alkyl groups having 1 to 30 carbon atoms. The aryl group having 6 to 30 ring carbon atoms is exemplified by the above aryl groups having 6 to 30 ring carbon atoms.

Examples of the ester group herein include an alkyl ester group. The alkyl ester group is represented by —C(=O)$OR^E$. Examples of $R^E$ include the above-described substituted or unsubstituted alkyl group.

A siloxanyl group herein is a silicon compound group via an ether bond, examples of which include a trimethylsiloxanyl group.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

Herein, a hydrogen atom includes isotope having different numbers of neutrons, specifically, protium, deuterium and tritium.

Herein, a substituent meant by a "substituted or unsubstituted" group is at least one group selected from the group consisting of an aryl group having 6 to 30 ring carbon atoms, a heteroaryl group having 5 to 30 ring atoms, a linear alkyl group having 1 to 30 carbon atoms, a branched alkyl group having 3 to 30 carbon atoms, a cycloalkyl group having 3 to 30 ring carbon atoms, an alkyl halide group having 1 to 30 carbon atoms, a substituted or unsubstituted silyl group (e.g., an alkylsilyl group having 3 to 30 carbon atoms and an arylsilyl having 6 to 30 ring carbon atoms), an alkoxy group having 1 to 30 carbon atoms, an aryloxy group having 6 to 30 ring carbon atoms, a substituted or unsubstituted amino group, an alkylthio group having 1 to 30 carbon atoms, an arylthio group having 6 to 30 ring carbon atoms, an aralkyl group having 7 to 30 carbon atoms, an alkenyl group having 2 to 30 carbon atoms, a halogen atom, an alkynyl group having 2 to 30 carbon atoms, a cyano group, a hydroxy group, a nitro group, a carboxy group, and a substituted phosphoryl group.

Herein, the substituent meant by a "substituted or unsubstituted" group is also exemplified by diaryl boron group ($Ar_{B1}Ar_{B2}B-$). $Ar_{B1}$ and $Ar_{B2}$ are exemplified by the above "aryl group having 6 to 30 ring carbon atoms."

Specific examples and preferable examples of the substituent meant by "substituted or unsubstituted" are the same as specific examples and preferable examples of the substituent described in "Description of Each Substituent."

The substituent meant by a "substituted or unsubstituted" group may be further substituted by at least one group selected from the group consisting of an aryl group having 6 to 30 ring carbon atoms, a heteroaryl group having 5 to 30 ring atoms, a linear alkyl group having 1 to 30 carbon atoms, a branched alkyl group having 3 to 30 carbon atoms, a cycloalkyl group having 3 to 30 ring carbon atoms, an alkyl halide group having 1 to 30 carbon atoms, an alkylsilyl group having 3 to 30 carbon atoms, an arylsilyl having 6 to 30 ring carbon atoms, an alkoxy group having 1 to 30 carbon atoms, an aryloxy group having 6 to 30 ring carbon atoms, a substituted amino group, an alkylthio group having 1 to 30 carbon atoms, an arylthio group having 6 to 30 ring carbon atoms, an aralkyl group having 7 to 30 carbon atoms, an alkenyl group having 2 to 30 carbon atoms, an alkynyl group having 2 to 30 carbon atoms, a halogen atom, a cyano group, a hydroxy group, a nitro group, and a carboxy group. In addition, plural ones of these substituents may be mutually bonded to form a ring.

The term "unsubstituted" used in a "substituted or unsubstituted" means that a hydrogen atom(s) is not substituted by the above-described substituent.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of a substituted ZZ group.

Herein, "XX to YY atoms" in the description of "substituted or unsubstituted ZZ group having XX to YY atoms" represent atoms of an unsubstituted ZZ group and does not include atoms of a substituent(s) of the substituted ZZ group.

The same description as the above applies to "substituted or unsubstituted" in compounds or moieties thereof described herein.

Herein, when the substituents are bonded to each other to form a ring, the ring is structured to be a saturated ring, an unsaturated ring, an aromatic hydrocarbon ring or a hetero ring.

Herein, examples of the aromatic hydrocarbon group and the heterocyclic group in the linking group include a divalent or multivalent group obtained by eliminating one or more atoms from the above monovalent groups.

EXAMPLES

Example(s) of the invention will be described below. However, the invention is not limited to Example(s).

Compounds

Compounds used for preparing an organic EL device will be shown below.

[Formula 24]

HI

HT-1

[Formula 25]

HT-2

HT-3
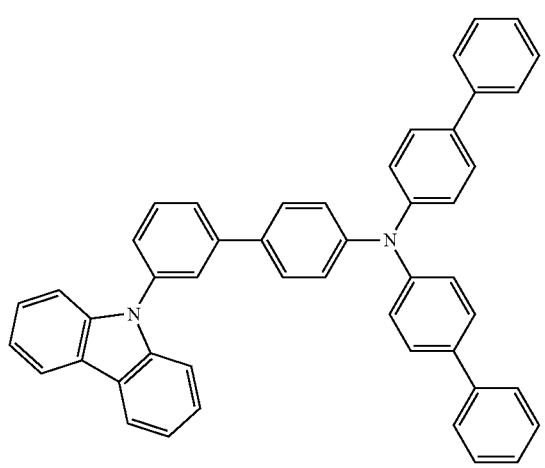
[Formula 27]
PGH-3
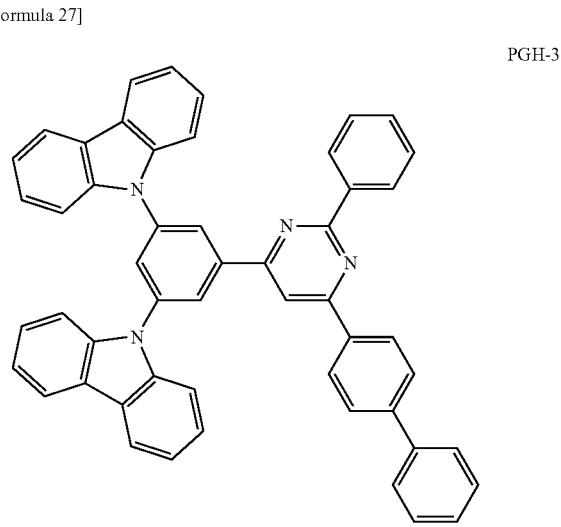
[Formula 26]
PGH-1
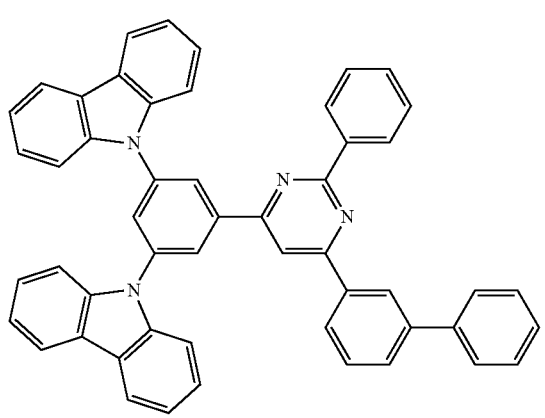
PGD
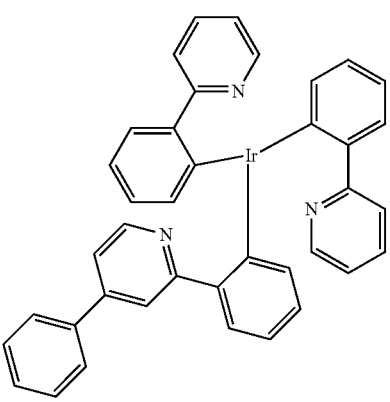
[Formula 28]
BH
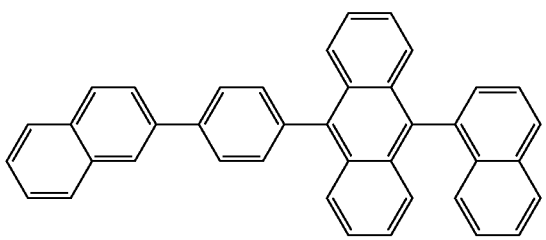
PGH-2
[Formula 29]
BH-2

[Formula 30]
BD-1
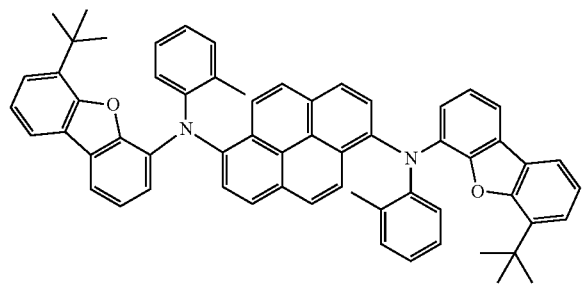
[Formula 31]
BD-2
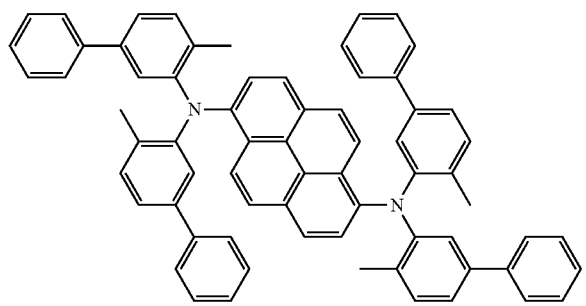
[Formula 32]
BD-3
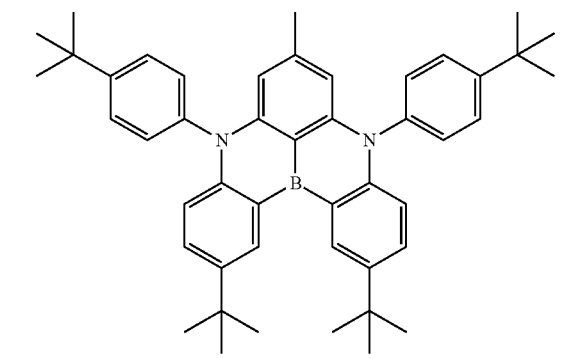
BD-4
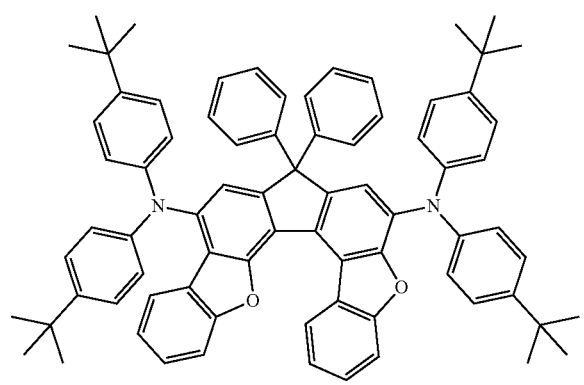
[Formula 33]
ET-1
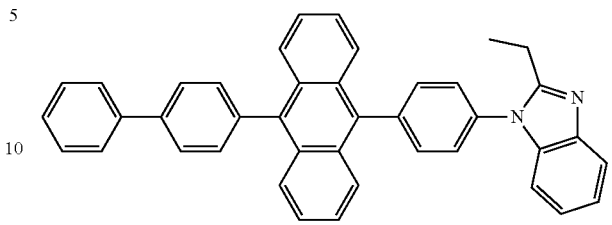
[Formula 34]
ET-2
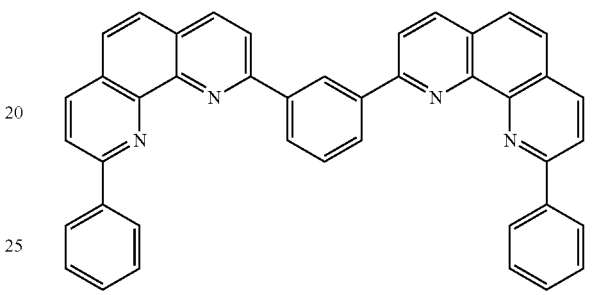
ET-3
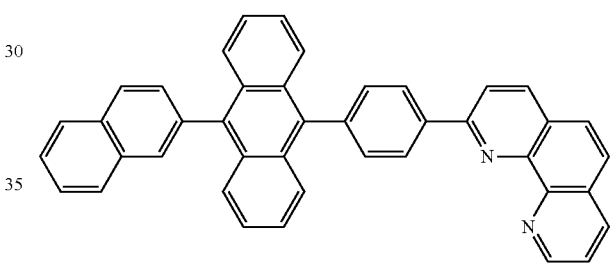
[Formula 35]
PRD
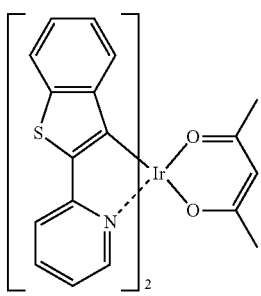
PGD-2
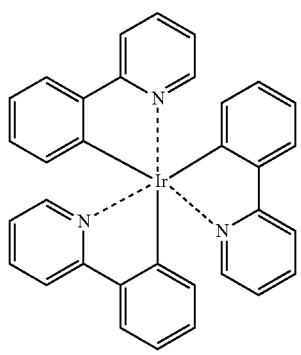

-continued

[Formula 36]

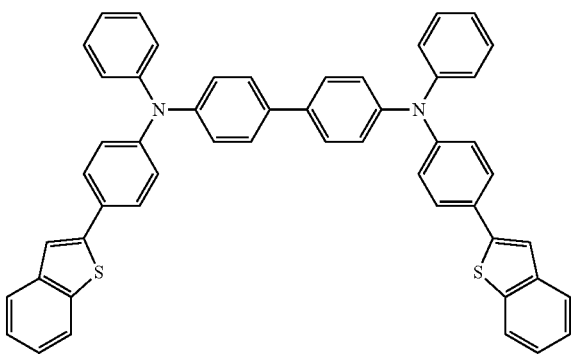

Cap1

Preparation of Organic EL Device

An organic EL device was manufactured as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was set to be 130-nm thick.

Formation of First Emitting Unit

After the glass substrate having the transparent electrode line was cleaned, the glass substrate was mounted on a substrate holder of a vacuum evaporation apparatus. Firstly, a compound HT-1 and a compound HI were co-deposited on a surface of the glass substrate where the transparent electrode line was provided in a manner to cover the transparent electrode, thereby forming a 10-nm-thick hole injecting layer. The concentrations of the compound HT-1 and the compound HI in the hole injecting layer were 97 mass % and 3 mass %, respectively.

Next, the compound HT-1 was vapor-deposited on the hole injecting layer to form a 117-nm-thick first hole transporting layer.

Next, a compound HT-2 was vapor-deposited on the first hole transporting layer to form a 10-nm-thick second hole transporting layer.

Next, a compound PGH-1 and a compound PGD were co-deposited on the second hole transporting layer to form a 40-nm-thick first emitting layer in a form of a yellow phosphorescent layer. The concentrations of the compound PGH-1 and the compound PGD in the yellow phosphorescent layer were 80 mass % and 20 mass %, respectively.

Next, a compound ET-1 was vapor-deposited on the yellow phosphorescent layer to form a 10-nm-thick electron transporting layer.

Formation of First Charge Generating Layer

Next, a compound ET-2 and lithium (Li) were co-deposited on the electron transporting layer to form a 10-nm-thick first N layer. The concentrations of the compound ET-2 and $L_1$ in the first N layer were 96 mass % and 4 mass %, respectively.

Next, the compound HT-1 and the compound HI were co-deposited on the first N layer to form a 10-nm-thick first P layer. The concentrations of the compound HT-1 and the compound HI in the first P layer were 90 mass % and 10 mass %, respectively.

Formation of Second Emitting Unit

Next, the compound HT-1 was vapor-deposited on the first P layer to form a 10-nm-thick first hole transporting layer.

Next, the compound HT-2 was vapor-deposited on the first hole transporting layer to form a 10-nm-thick second hole transporting layer.

Next, a compound BH and a compound BD-1 were co-deposited on the second hole transporting layer to form a 25-nm-thick second emitting layer in a form of a blue fluorescent layer. The concentrations of the compound BH and the compound BD-1 in the blue fluorescent layer were 96 mass % and 4 mass %, respectively.

Next, a compound PGH-2 was vapor-deposited on the blue fluorescent layer to form a 10-nm-thick electron transporting layer.

Formation of Second Charge Generating Layer

Next, the compound ET-2 and lithium (Li) were co-deposited on the electron transporting layer to form a 56-nm-thick second N layer. The concentrations of the compound ET-2 and Li in the second N layer were 96 mass % and 4 mass %, respectively.

Next, the compound HT-1 and the compound HI were co-deposited on the second N layer to form a 10-nm-thick second P layer. The concentrations of the compound HT-1 and the compound HI in the second P layer were 90 mass % and 10 mass %, respectively.

Formation of Third Emitting Unit

Next, the compound HT-1 was vapor-deposited on the second P layer to form a 10-nm-thick first hole transporting layer.

Next, the compound HT-2 was vapor-deposited on the first hole transporting layer to form a 10-nm-thick second hole transporting layer.

Next, the compound BH and a compound BD-1 were co-deposited on the second hole transporting layer to form a 25-nm-thick third emitting layer in a form of a blue fluorescent layer. The concentrations of the compound BH and the compound BD-1 in the blue fluorescent layer were 96 mass % and 4 mass %, respectively.

Next, the compound PGH-2 was vapor-deposited on the blue fluorescent layer to form a 10-nm-thick first electron transporting layer.

Next, the compound ET-1 was vapor-deposited on the first electron transporting layer to form a 12-nm-thick second electron transporting layer.

Next, lithium fluoride (LiF) was vapor-deposited on the second electron transporting layer to form a 1-nm-thick electron injecting layer.

Metal aluminum (Al) was then vapor-deposited on the electron injecting electrode to form an 80-nm-thick metal Al cathode.

The organic EL device of a bottom emission type was manufactured as described above.

A device arrangement of the organic EL device of Example 1 is roughly shown as follows.

ITO(130)/
HT-1:HI(10.97/0:3%)/HT-1(117)/HT-2(10)/PGH-1:PGD(40.80%:20%)/ET-1(10)/
ET-2:L(10.96%:4%)/HT-1:HI(10.90%:10%)/
HT-1(10)/HT-2(10)/BH:BD-1(25.96%:4%)/PGH-2(10)/

ET-2:Li(56.96%:4%)/HT-1:HI(10.90%:10%)/
HT-1(10)/HT-2(10)/BH:BD-1(25.96%:4%)/PGH-2(10)/
    ET-1(12)/LiF(1)/
Al(80)

Numerals in parentheses represent a film thickness (unit: nm).

The numerals represented by percentage in the same parentheses indicate, for instance in case of HT-1:HI (10, 97%:3%), a ratio (mass %) between the compounds HT-1 and HI in the hole injecting layer being HT-1:HI=97 mass %:3 mass %.

The same notations apply to the description below.

Example 2

An organic EL device of a bottom emission type was manufactured in the same manner as in Example 1 except that the thickness and the material for each layer were changed to have the device arrangement below.

A device arrangement of the organic EL device of Example 2 is roughly shown as follows.

ITO(80)/HT-1:HI(10.97/0:3%)/HT-1(10)/HT-2(10)/BH:
BD-1 (25.96%:4%)/PGH-3(10)/
    ET-2: Li(10.96%:4%)/HT-1:HI(10.90%:10%)/
    HT-1(10)/HT-2(10)/PGH-1:PGD(48.80%:20%)/ET-1
    (10)/
    ET-2: Li(95.96%:4%)/HT-1:HI(10, 90%:10%)/
    HT-1(10)/HT-2(10)/BH:BD-1(25.96%:4%)/PGH-1(10)/
ET-1(10)/LiF(1)/
    Al(80)

Example 3

An organic EL device of a bottom emission type was manufactured in the same manner as in Example 1 except that the thickness and the material for each layer were changed to have the device arrangement below.

A device arrangement of an organic EL device of Example 3 is roughly shown as follows.

ITO(130)/
HT-1:HI(10.97/0:3%)/HT-1(70)/HT-2(10)/BH:BD-1
    (25.96%:4%)/PGH-3(10)/
ET-2:Li(10.96%:4%)/HT-1:HI(10, 90%: 10%)/
HT-1(10)/HT-2(10)/PGH-1:PGD(48.80%:20%)/ET-1
    (10)/
ET-2:Li(95.96%:4%)/HT-1:HI(10, 90%:10%)/
HT-1(10)/HT-2(10)/BH:BD-1(25.96%:4%)/PGH-2(10)/
    ET-1(10)/LiF(1)/
Al(80)

Example 4

An APC (Ag—Pd—Cu) layer (reflective layer) having a film thickness of 100 nm, which was silver alloy layer, and an indium zinc oxide (IZO: registered trademark) film (transparent conductive layer) having a thickness of 10 nm were sequentially formed by sputtering on a glass substrate (25 mm×75 mm×0.7 mm thickness) to be a substrate for manufacturing a device. By this operation, a conductive material layer of the APC layer and the IZO film was obtained.

Subsequently, the conductive material layer was patterned by etching using a resist pattern as a mask using a normal lithography technique to form a lower electrode (anode).

Formation of First Emitting Unit

Next, the compound HT-1 and the compound HI were co-deposited on the lower electrode through vacuum deposition to form a 10-nm-thick hole injecting layer. The concentrations of the compound HT-1 and the compound HI in the hole injecting layer were 97 mass % and 3 mass %, respectively.

Next, the compound HT-1 was vapor-deposited on the hole injecting layer to form a 10-nm-thick first hole transporting layer on the hole injecting layer.

Next, a compound HT-3 was vapor-deposited on the first hole transporting layer to form a 5-nm-thick second hole transporting layer.

Next, the compound BH and the compound BD-2 were co-deposited on the second hole transporting layer to form a 20-nm-thick first emitting layer in a form of a blue fluorescent layer. The concentrations of the compound BH and the compound BD-2 in the blue fluorescent layer were 98 mass % and 2 mass %, respectively.

Next, the compound PGH-2 was vapor-deposited on the blue fluorescent layer to form a 5-nm-thick electron transporting layer.

Formation of First Charge Generating Layer

Next, the compound ET-3 and lithium (Li) were co-deposited on the electron transporting layer to form a 58-nm-thick first N layer. The concentrations of the compound ET-3 and Li in the first N layer were 96 mass % and 4 mass %, respectively.

Next, the compound HT-1 and the compound HI were co-deposited on the first N layer to form a 10-nm-thick first P layer. The concentrations of the compound HT-1 and the compound HI in the first P layer were 90 mass % and 10 mass %, respectively.

Formation of Second Emitting Unit

Next, the compound HT-1 was vapor-deposited on the first P layer to form a 10-nm-thick first hole transporting layer.

Next, the compound HT-3 was vapor-deposited on the first hole transporting layer to form a 5-nm-thick second hole transporting layer.

Next, the compound BH and the compound BD-2 were co-deposited on the second hole transporting layer to form a 20-nm-thick second emitting layer in a form of a blue fluorescent layer. The concentrations of the compound BH and the compound BD-2 in the blue fluorescent layer were 98 mass % and 2 mass %, respectively.

Next, the compound PGH-2 was vapor-deposited on the blue fluorescent layer to form a 5-nm-thick electron transporting layer.

Formation of Second Charge Generating Layer

Next, the compound ET-3 and lithium (Li) were co-deposited on the electron transporting layer to form a 64-nm-thick second N layer. The concentrations of the compound ET-3 and Li in the first N layer were 96 mass % and 4 mass %, respectively.

Next, the compound HT-1 and the compound HI were co-deposited on the second N layer to form a 10-nm-thick second P layer. The concentrations of the compound HT-1 and the compound HI in the second P layer were 90 mass % and 10 mass %, respectively.

Formation of Third Emitting Unit

Next, the compound HT-1 was vapor-deposited on the second P layer to form a 10-nm-thick first hole transporting layer on the second P layer.

Next, the compound HT-3 was vapor-deposited on the first hole transporting layer to form a 5-nm-thick second hole transporting layer.

Next, the compound BH and the compound BD-2 were co-deposited on the second hole transporting layer to form a 20-nm-thick third emitting layer in a form of a blue fluorescent layer. The concentrations of the compound BH and the compound BD-2 in the blue fluorescent layer were 98 mass % and 2 mass %, respectively.

Next, the compound PGH-2 was vapor-deposited on the blue fluorescent layer to form a 5-nm-thick first electron transporting layer.

Next, the compound ET-1 was vapor-deposited on the first electron transporting layer to form a 15-nm-thick second electron transporting layer.

Next, lithium fluoride (LiF) was vapor-deposited on the second electron transporting layer to form a 1-nm-thick electron injecting layer.

Subsequently, Mg and Ag were co-deposited on the electron injecting layer at a mixing ratio (mass % ratio) of 1:9, thereby forming a 12-nm thick semi-transparent upper electrode (cathode) formed of Mg—Ag alloy.

Next, a compound Cap1 was deposited on the entire surface of the upper electrode to form a 70-nm-thick capping layer.

The organic EL device of a top emission type was manufactured as described above.

A device arrangement of an organic EL device of Example 4 is roughly shown as follows.

APC(100)/IZO(10)/
HT-1:HI(10.97%:3%)/HT-1(10)/HT-3(5)/BH: BD-2(20.98%:2%)/PGH-2(5)/
ET-3:Li(58.96V0:4%)/HT-1:HI(10.90%: 10%)/
HT-1(10)/HT-3(5)/BH:BD-2(20.98%:2%)/PGH-2(5)/
ET-3:Li(64.96V0:4%)/HT-1:HI(10.90%:10%)/
HT-1(10)/HT-3(5)/BH:BD-2(20.98%,2%)/PGH-2(5)/ET-1(15)/LiF(1)/
Mg:Ag(12.10%:90%)/Cap1(70)

Example 5

An organic EL device of a bottom emission type was manufactured in the same manner as in Example 1 except that the thickness and the material for each layer were changed to have the device arrangement below. A device arrangement of an organic EL device of Example 5 is roughly shown as follows.

ITO(130)/
HT-1:HI(10.97/0:3%)/HT-1(117)/HT-2(10)/PGH-1: PGD(40.80%:20%)/ET-1(10)/
ET-2:Li(10.96%:4%)/HT-1:HI(10.90%:10%)/
HT-1(10)/HT-2(10)/BH:BD-1(25.96%:4%)/PGH-2(10)/
ET-2:Li(56.96V0:4%)/HT-1:HI(10.90%:10%)/
HT-1(10)/HT-2(10)/BH:BD-1(25.96%:4%)/PGH-2(10)/
ET-1(70)/LiF(1)/
Al(80)

Example 6

An organic EL device of a bottom emission type was manufactured in the same manner as in Example 1 except that the thickness and the material for each layer were changed to have the device arrangement below.

A device arrangement of an organic EL device of Example 6 is roughly shown as follows.

ITO(130)/
HT-1:HI(10.97%:3%)/HT-1(117)/HT-2(10)/PGH-1: PRD(5.98%:2%)/PGH-1:PGD(35.80%:20%)/ET-1(10)/
ET-2:Li(10.96%:4%)/HT-1:HI(10.90%:10%)/
HT-1(10)/HT-2(10)/BH:BD-3(25.96%:4%)/PGH-2(10)/
ET-2:Li(56.96V0:4%)/HT-1:HI(10.90%:10%)/
HT-1(10)/HT-2(10)/BH:BD-3(25.96%:4%)/PGH-2(10)/
ET-1(12)/LiF(1)/
Al(80)

Example 7

An organic EL device of a bottom emission type was manufactured in the same manner as in Example 1 except that the thickness and the material for each layer were changed to have the device arrangement below.

A device arrangement of an organic EL device of Example 7 is roughly shown as follows.

ITO(80)/
HT-1:HI(10.97%:3%)/HT-1(10)/HT-2(10)/BH-2:BD-4(25.96%:4%)/PGH-3(10)/
ET-2:Li(10.96%:4%)/HT-1:HI(10.90%:10%)/
HT-1(10)/HT-2(10)/PGH-1:PRD(5.98%:2%)/PGH-1:PGD-2(43.80%:20%)/ET-1(10)/
ET-2:Li(95.96V0:4%)/HT-1:HI(10.90%: 10%)/
HT-1(10)/HT-2(10)/BH-2:BD-4(25.96V0:4%)/PGH-1(10)/ET-1(1)/LiF(1)/
Al(80)

Example 8

An organic EL device of a top emission type was manufactured in the same manner as in Example 4 except that the thickness and the material for each layer were changed to have the device arrangement below.

A device arrangement of an organic EL device of Example 8 is roughly shown as follows.

APC(100)/IZO(10)/
HT-1:HI(10.97%:3%)/HT-1(10)/HT-3(5)/BH: BD-2(20.98%:2%)/PGH-2(5)/
ET-3:Li(96.96V0:4%)/HT-1:HI(10.90%: 10%)/
HT-1(10)/HT-3(5)/BH:BD-2(20.98%:2%)/PGH-2(5)/
ET-3:Li(64.96V0:4%)/HT-1:HI(10.90%: 10%)/
HT-1(10)/HT-3(5)/BH:BD-2(20.98%,2%)/PGH-2(5)/ET-1(15)/LiF(1)/
Mg:Ag(12.10%:90%)/Cap1(70)

Comparative 1

An organic EL device of a bottom emission type was manufactured in the same manner as in Example 1 except that the thickness and the material for each layer were changed to have the device arrangement below.

A device arrangement of the organic EL device of Comparative 1 is roughly shown as follows.

ITO(130)/
HT-1:HI(10.97/0:3%)/HT-1(117)/HT-2(10)/PGH-1: PGD(40.80%:20%)/ET-1(10)/
ET-2:Li(10.96%:4%)/HT-1:HI(10.90%:10%)/
HT-1(10)/HT-2(10)/BH:BD-1(25.96%:4%)/PGH-2(10)/
ET-2:Li(10.96%:4%)/HT-1:HI(10.90%:10%)/
HT-1(56)/HT-2(10)/BH:BD-1(25.96%:4%)/PGH-2(10)/
ET-1(12)/LiF(1)/
Al(80)

Comparative 2

An organic EL device of a bottom emission type was manufactured in the same manner as in Example 1 except that the thickness and the material for each layer were changed to have the device arrangement below.

A device arrangement of the organic EL device of Comparative 2 is roughly shown as follows.

ITO(80)/
HT-1:HI(10.97/0:3%)/HT-1(10)/HT-2(10)/BH: BD-1(25.96%:4%)/PGH-3(10)/
ET-2:Li(10.96%:4%)/HT-1:HI(10.90%:10%)/
HT-1(10)/HT-2(10)/PGH-1:PGD(48.80%:20%)/ET-1(10)/

ET-2:Li(10.96%:4%)/HT-1:HI(10.90%:10%)/
HT-1(95)/HT-2(10)/BH:BD-1(25.96%:4%)/PGH-2(10)/
   ET-1(10)/LiF(1)/
Al(80)

Comparative 3

An organic EL device of a bottom emission type was manufactured in the same manner as in Example 1 except that the thickness and the material for each layer were changed to have the device arrangement below.

A device arrangement of the organic EL device of Comparative 3 is roughly shown as follows.

ITO(80)/
HT-1:HI(10.97%:3%)/HT-1(10)/HT-2(10)/BH: BD-1(25.96%:4%)/PGH-3(10)/
ET-2:Li(10.96%:4%)/HT-1:HI(10.90%:10%)/
HT-1(10)/HT-2(10)/BH:BD-1(25.96%:4%)/ET-1(10)/
ET-2:Li(95.96V0:4%)/HT-1:HI(10.90%: 10%)/
HT-1(10)/HT-2(10)/PGH-1:PGD(48.80%:20%)/PGH-2(10)/ET-1(10)/LiF(1)/
Al(80)

Comparative 4

An organic EL device of a bottom emission type was manufactured in the same manner as in Example 1 except that the thickness and the material for each layer were changed to have the device arrangement below.

A device arrangement of the organic EL device of Comparative 4 is roughly shown as follows.

ITO(130)/
HT-1:HI(10.97/0:3%)/HT-1(117)/HT-2(10)/PGH-1: PGD(40.80%:20%)/ET-1(10)/
ET-2:Li(10.96%:4%)/HT-1:HI(10.90%:10%)/
HT-1(10)/HT-2(10)/BH:BD-1(25.96%:4%)/PGH-2(10)/
   ET-2(46)/
ET-2: Li(10.96%:4%)/HT-1:HI(10.90%:10%)/
HT-1(10)/HT-2(10)/BH:BD-1(25.96%:4%)/PGH-2(10)/
   ET-1(12)/LiF(1)/
Al(80)

Comparative 5

An organic EL device of a bottom emission type was manufactured in the same manner as in Example 1 except that the thickness and the material for each layer were changed to have the device arrangement below and the third emitting unit was not formed.

A device arrangement of the organic EL device of Comparative 5 is roughly shown as follows.

ITO(120)/
HT-1:HI(14.97%:3%)/HT-1(60)/BH:BD-1(22, 96%:4%)/
   ET-1(20)/
ET-2:Li(20.96%:4%)/HT-1:H1(10.90%:10%)/
HT-1(30)/PGH-1:PGD(40.80%:20%)/ET-1(10)/
ET-2:Li(15.96%:4%)/
Al(80)

$m_1$ to $m_3$, $L_1$ to $L_3$, and $\phi_1$ to $\phi_3$

With respect to the organic EL devices manufactured in Examples 1 to 8 and Comparatives 1 to 5, $m_1$ to $m_3$, $L_1$ to $L_3$, and $\phi_1$ to $\phi_3$ in the numerical formulae (1-1) to (1-3) and (2-1) to (2-3) were obtained. The results are shown in Table 1.

A main peak wavelength of light from the blue emitting layer, yellow phosphorescent layer, red-yellow phosphorescent layer, and red-green phosphorescent layer was measured by the above-described method.

The red-yellow phosphorescent layer refers to the first emitting layer (a phosphorescent layer formed of a red phosphorescent layer and a yellow phosphorescent layer) in Example 6. The red-green phosphorescent layer refers to the second emitting layer (a phosphorescent layer formed of a red phosphorescent layer and a green phosphorescent layer) in Example 7.

$\phi_1$ was calculated using n and k of a complex refractive index $N=n-jk$ (n: refractive index, k: extinction coefficient) of a reflective electrode (the cathode in Example 1) and a refractive index no of each of the organic layers forming the first emitting unit (in Example 1, the first hole transporting zone (the hole injecting layer, the first hole transporting layer, and the second hole transporting layer), the first emitting layer, and the first electron transporting zone (the electron transporting layer)).

$\phi_2$ was calculated using n and k of the complex refractive index $N=n-jk$ (n: refractive index, k: extinction coefficient) of the reflective electrode (the cathode in Example 1) and the refractive index no of each of the organic layers forming the second emitting unit (in Example 1, the second hole transporting zone (the first hole transporting layer, and the second hole transporting layer), the second emitting layer, and the second electron transporting zone (the electron transporting layer)).

$\phi_3$ was calculated using n and k of the complex refractive index $N=n-jk$ (n: refractive index, k: extinction coefficient) of the reflective electrode (the cathode in Example 1) and the refractive index $n_0$ of each of the organic layers forming the third emitting unit (in Example 1, the third hole transporting zone (the first hole transporting layer, and the second hole transporting layer), the third emitting layer, and the third electron transporting zone (the first electron transporting layer, the second electron transporting layer, and the electron injecting layer)).

$\phi_1$ to $\phi_3$ can be calculated with reference to, for instance, Principles of Optics, Max Born and Emil Wolf, 1974 (PERGAMON PRESS).

$\phi_1$ to $\phi_3$ in Examples 2 to 8 and Comparatives 1 to 5 also can be calculated in the same manner as above.

The refractive index of the organic layer was measured with a spectroscopic ellipsometry measuring device.

The refractive index means a refractive index in a direction perpendicular to a formation surface of the layer.

TABLE 1

| | First Emitting Layer | | | | | | Second Emitting Layer | | |
|---|---|---|---|---|---|---|---|---|---|
| | interference coefficient $m_1$ | optical distance $L_1$ (nm) | phase change $\phi_1$ | dopant | main peak wavelength (nm) | color | interference coefficient $m_2$ | optical distance $L_2$ (nm) | phase change $\phi_2$ |
| Ex. 1 | 1.09 | 428 | −2.64 | PGD | 568 | yellow | 0.90 | 294 | −2.48 |
| Ex. 2 | 2.02 | 550 | −2.48 | BD-1 | 455 | blue | 0.88 | 368 | −2.64 |
| Ex. 3 | 2.02 | 550 | −2.48 | BD-1 | 455 | blue | 0.88 | 368 | −2.64 |

TABLE 1-continued

| | | | | | | | | | |
|---|---|---|---|---|---|---|---|---|---|
| Ex. 4 | 0.07 | 87 | −1.91 | BD-2 | 458 | blue | 0.99 | 297 | −1.91 |
| Ex. 5 | 1.45 | 531 | −2.64 | PGD | 568 | yellow | 1.37 | 402 | −2.48 |
| Ex. 6 | 1.04 | 451 | −2.68 | PRD | 616 | red | 0.90 | 294 | −2.48 |
| | 1.18 | 455 | −2.64 | PGD | 568 | yellow | | | |
| Ex. 7 | 2.02 | 550 | −2.48 | BD-4 | 455 | blue | 0.87 | 398 | −2.68 |
| | | | | | | | 1.19 | 409 | −2.57 |
| Ex. 8 | 0.07 | 87 | −1.91 | BD-2 | 458 | blue | 1.33 | 373 | −1.91 |
| Comp. 1 | 1.08 | 424 | −2.64 | PGD | 568 | yellow | 0.88 | 291 | −2.48 |
| Comp. 2 | 2.00 | 544 | −2.48 | BD-1 | 455 | blue | 0.85 | 361 | −2.64 |
| Comp. 3 | 2.02 | 550 | −2.48 | BD-1 | 455 | blue | 1.40 | 407 | −2.48 |
| Comp. 4 | 1.09 | 428 | −2.64 | PGD | 568 | yellow | 0.90 | 294 | −2.48 |
| Comp. 5 | 0.89 | 292 | −2.48 | BD-1 | 455 | blue | −0.11 | 88 | −2.64 |

| | Second Emitting Layer | | | Third Emitting Layer | | | | | |
|---|---|---|---|---|---|---|---|---|---|
| | dopant | main peak wavelength (nm) | color | interference coefficient $m_3$ | optical distance $L_3$ (nm) | phase change $\phi_2$ | dopant | main peak wavelength (nm) | color |
| Ex. 1 | BD-1 | 455 | blue | −0.11 | 65 | −2.48 | BD-1 | 455 | blue |
| Ex. 2 | PGD | 568 | yellow | −0.13 | 61 | −2.48 | BD-1 | 455 | blue |
| Ex. 3 | PGD | 568 | yellow | −0.13 | 61 | −2.48 | BD-1 | 455 | blue |
| Ex. 4 | BD-2 | 458 | blue | 1.96 | 519 | −1.91 | BD-2 | 458 | blue |
| Ex. 5 | BD-1 | 455 | blue | 0.37 | 173 | −2.48 | BD-1 | 455 | blue |
| Ex. 6 | BD-3 | 455 | blue | −0.11 | 65 | −2.48 | BD-3 | 455 | blue |
| Ex. 7 | PRD | 616 | red | −0.13 | 61 | −2.48 | BD-4 | 455 | blue |
| | PGD-2 | 511 | green | | | | | | |
| Ex. 8 | BD-2 | 458 | blue | 2.30 | 595 | −1.91 | BD-2 | 458 | blue |
| Comp. 1 | BD-1 | 455 | blue | −0.11 | 65 | −2.48 | BD-1 | 455 | blue |
| Comp. 2 | PGD | 568 | yellow | −0.13 | 61 | −2.48 | BD-1 | 455 | blue |
| Comp. 3 | BD-1 | 455 | blue | −0.14 | 79 | −2.64 | PGD | 568 | yellow |
| Comp. 4 | BD-1 | 455 | blue | −0.11 | 65 | −2.48 | BD-1 | 455 | blue |
| Comp. 5 | PGD | 568 | yellow | — | — | — | — | — | — |

Evaluation

The organic EL devices manufactured in Examples 1 to 8 and Comparatives 1 to 5 were evaluated as follows. Results are shown in Table 2.

Main Peak Wavelength and Peak Intensity of Blue Fluorescence

A main peak wavelength of blue fluorescence obtained from each of the organic EL devices was measured. Moreover, an intensity of blue fluorescence was measured.

Voltage was applied on each of the organic EL devices such that a current density was 10 mA/cm², where spectral radiance spectra were measured by a spectroradiometer CS-2000 (manufactured by Konica Minolta, Inc.).

In the obtained spectral radiance spectra, a peak wavelength and an intensity of the emission spectrum, at which the luminous intensity of the emission spectrum were at the maximum, were measured and defined as a "main peak wavelength (unit: nm) of blue fluorescence" and a "main peak intensity of blue fluorescence" in this evaluation.

Drive Voltage

The voltage (unit: V) when electric current was applied between the anode and the cathode such that the current density was 10 mA/cm² was measured. The drive voltage was evaluated based on the following evaluation criteria.

Evaluation Criteria

A: drive voltage of less than 12 V
B: drive voltage of 12 V or more

Lifetime of Blue Fluorescence

Voltage was applied on each of the organic EL devices such that a current density was 50 mA/cm², where spectral radiance spectra were measured each current-applied time by a spectroradiometer CS-2000 (manufactured by Konica Minolta, Inc.), and an emission peak intensity at 460 nm that falls within a blue wavelength region was measured. A ratio of the emission peak intensity after the current was applied relative to the initial emission peak intensity was calculated. A time elapsed before the peak intensity was decreased by 5% relative to the initial emission peak intensity was defined as 5% deterioration lifetime (unit: minutes). A 5%-deterioration lifetime ratio was calculated by the following calculation equation. In other words, the 5%-deterioration lifetime represents a time elapsed before the emission peak intensity was decreased to 0.95X in which X represents the initial emission peak intensity.

The 5%-deterioration lifetime ratio of each of the devices in Examples relative to Example 1 was obtained. The 5%-deterioration lifetime ratios were compared.

The lifetime of blue fluorescence emitted from each of the organic EL device was judged in accordance with the evaluation criteria.

Calculation Equation: 5%−deterioration lifetime ratio (%)=(5%−deterioration lifetime in each Example/5%−deterioration lifetime in Example 1)×100

Evaluation Criteria

A: 5%-deterioration lifetime ratio of 90% or more
B: 5%-deterioration lifetime ratio of 80% or more and less than 90%
C: 5%-deterioration lifetime ratio of less than 80%

TABLE 2

| Device | emission direction | First Emitting Unit | | | | | | First Charge Generating Layer | | Second Emitting Layer | | | | | |
|---|---|---|---|---|---|---|---|---|---|---|---|---|---|---|---|
| | | HT zone | | | first emitting layer | | ET zone | | | HT zone | | second emitting layer | | ET zone | |
| | | HI layer (nm) | HT layer 1 (nm) | HT layer 2 (nm) | thickness (nm) | color | ET layer (nm) | first N layer thickness (nm) | first P layer thickness (nm) | HT layer 1 (nm) | HT layer 2 (nm) | thickness (nm) | color | ET layer (nm) |
| Ex. 1 | Bottom | 10 | 117 | 10 | 40 | yellow | 10 | 10 | 10 | 10 | 10 | 25 | blue | 10 |
| Ex. 2 | Bottom | 10 | 10 | 10 | 25 | blue | 10 | 10 | 10 | 10 | 10 | 48 | yellow | 10 |
| Ex. 3 | Bottom | 10 | 70 | 10 | 25 | blue | 10 | 10 | 10 | 10 | 10 | 48 | yellow | 10 |
| Ex. 4 | Top | 10 | 10 | 5 | 20 | blue | 5 | 58 | 10 | 10 | 5 | 20 | blue | 5 |
| Ex. 5 | Bottom | 10 | 117 | 10 | 40 | yellow | 10 | 10 | 10 | 10 | 10 | 25 | blue | 10 |
| Ex. 6 | Bottom | 10 | 117 | 10 | 5/35 | red/yellow | 10 | 10 | 10 | 10 | 10 | 25 | blue | 10 |
| Ex. 7 | Bottom | 10 | 10 | 10 | 25 | blue | 10 | 10 | 10 | 10 | 10 | 5/43 | red/green | 10 |
| Ex. 8 | Top | 10 | 10 | 5 | 20 | blue | 5 | 96 | 10 | 10 | 5 | 20 | blue | 5 |
| Comp. 1 | Bottom | 10 | 117 | 10 | 40 | yellow | 10 | 10 | 10 | 10 | 10 | 25 | blue | 10 |
| Comp. 2 | Bottom | 10 | 10 | 10 | 25 | blue | 10 | 10 | 10 | 10 | 10 | 48 | yellow | 10 |
| Comp. 3 | Bottom | 10 | 10 | 10 | 25 | blue | 10 | 10 | 10 | 10 | 10 | 25 | blue | 10 |
| Comp. 4 | Bottom | 10 | 117 | 10 | 40 | yellow | 10 | 10 | 10 | 10 | 10 | 25 | blue | 56 |
| Comp. 5 | Bottom | 14 | 60 | — | 22 | blue | 20 | 20 | 10 | 30 | — | 40 | yellow | 25 |

| | Second Charge Generating Layer | | Third Emitting Layer | | | | | Evaluation | | | | | |
|---|---|---|---|---|---|---|---|---|---|---|---|---|---|
| | | | HT zone | | third emitting layer | | ET zone | | | | blue fluorescence | | |
| | second N layer thickness (nm) | second P layer thickness (nm) | HT layer 1 (nm) | HT layer 2 (nm) | thickness (nm) | color | ET layer (nm) | voltage (V) | judgement | main peak wave-length (nm) | main peak intensity (—) | 5% deterioration lifetime ratio (%) | judgement |
| Ex. 1 | 56 | 10 | 10 | 10 | 25 | blue | 23 | 11.2 | A | 456 | 0.384 | 100% | A |
| Ex. 2 | 95 | 10 | 10 | 10 | 25 | blue | 21 | 11.3 | A | 457 | 0.360 | 92% | A |
| Ex. 3 | 95 | 10 | 10 | 10 | 25 | blue | 21 | 11.3 | A | 456 | 0.353 | 88% | B |
| Ex. 4 | 64 | 10 | 10 | 5 | 20 | blue | 21 | 10.6 | A | 455 | 1.093 | 120% | A |
| Ex. 5 | 56 | 10 | 10 | 10 | 25 | blue | 81 | 11.8 | A | 491 | 0.049 | 100% | A |
| Ex. 6 | 56 | 10 | 10 | 10 | 25 | blue | 23 | 11.2 | A | 456 | 0.384 | 100% | A |
| Ex. 7 | 95 | 10 | 10 | 10 | 25 | blue | 21 | 11.3 | A | 457 | 0.360 | 92% | A |
| Ex. 8 | 64 | 10 | 10 | 5 | 20 | blue | 21 | 11.0 | A | 499 | 0.389 | 120% | A |
| Comp. 1 | 10 | 10 | 56 | 10 | 25 | blue | 23 | 11.4 | A | 456 | 0.384 | 65% | C |
| Comp. 2 | 10 | 10 | 95 | 10 | 25 | blue | 21 | 11.6 | A | 456 | 0.353 | 53% | C |
| Comp. 3 | 95 | 10 | 10 | 10 | 48 | yellow | 21 | 11.3 | A | 457 | 0.360 | 68% | C |
| Comp. 4 | 10 | 10 | 10 | 10 | 25 | blue | 23 | 13.0 | B | 456 | 0.300 | 90% | A |
| Comp. 5 | — | — | — | — | — | — | — | 8.0 | A | 454 | 0.144 | 40% | C |

Explanation of Table 2

The HT zone represents the hole transporting zone.

The HI layer represents the hole injecting layer.

The HT layer 1 represents the first hole transporting layer. The HT layer 2 represents the second hole transporting layer.

The ET zone represents the electron transporting zone.

The ET layer represents the electron transporting layer.

When the electron transporting layer includes a plurality of layers, the thickness of the ET layer represents a total thickness of the layers.

5/35 represents that a 5-nm red phosphorescent layer and a 35-nm yellow phosphorescent layer are laminated.

5/43 represents that a 5-nm red phosphorescent layer and a 43-nm green phosphorescent layer are laminated.

As shown in Table 2, the organic EL devices of Examples 1 to 8 exhibited a lower drive voltage and a higher value of the "5%-deterioration lifetime ratio" of blue fluorescence than those of the organic EL devices of Comparatives 1 to 5.

Thus, according to the organic EL devices of Examples 1 to 8, the drive voltage can be reduce and the lifetime can be prolonged.

Moreover, the organic EL devices with the third emitting unit satisfying a formula of optical interference (specifically, the numerical formulae (1-3) and (2-3)) in Examples 1 to 4, 6 and 7 exhibited a large main peak intensity of blue fluorescence. Therefore, according to the organic EL devices in Examples 1 to 4, 6 and 7, the luminous efficiency of blue fluorescence can be improved.

The invention claimed is:

1. An organic electroluminescence device comprising:
   an anode;
   a cathode;
   a first emitting unit comprising a first emitting layer;
   a first charge generating layer;
   a second emitting unit comprising a second emitting layer;

a second charge generating layer; and a third emitting unit comprising a third emitting layer, wherein the first emitting unit, the first charge generating layer, the second emitting unit, the second charge generating layer, and the third emitting unit are provided between the anode and the cathode in this order from the anode, the second charge generating layer comprises an N layer close to the anode and a P layer close to the cathode, the third emitting layer comprises a blue fluorescent compound, at least one of the first emitting layer or the second emitting layer comprises a blue fluorescent compound, the third emitting unit further comprises a hole transporting zone of the third emitting unit between the second charge generating layer and the third emitting layer, the hole transporting zone of the third emitting unit is in contact with the second charge generating layer, and a thickness of the hole transporting zone of the third emitting unit is in a range from 5 nm to 40 nm and smaller than a thickness of the N layer, and the thickness of the N layer is 40 nm or more.

2. The organic electroluminescence device according to claim 1, wherein one of the anode and the cathode is a reflective electrode, and the organic electroluminescence device satisfies numerical formulae (1-3) and (2-3), $$n_3-0.25<m_3<n_3+0.25 \quad (1\text{-}3)$$

in the numerical formula (1-3), $n_3$ represents an integer of 0 or more, and $m_3$ represents an order of interference between the reflective electrode and a light emission center of the third emitting layer, $$m_3=2L_3/\lambda_3+\phi_3/2\pi \quad (2\text{-}3)$$

in the formula (2-3), $m_3$ represents the same as $m_3$ in the numerical formula (1-3), $L_3$ represents an optical distance (nm) between the reflective electrode and the light emission center of the third emitting layer, $\lambda_3$ represents a main peak wavelength (nm) of light emission from the third emitting layer, and $\phi_3$ represents a phase change occurring when the light emission from the third emitting layer is reflected on the reflective electrode.

3. The organic electroluminescence device according to claim 2, wherein $n_3$ represents an integer from 0 to 3 in the formula (1-3).

4. The organic electroluminescence device according to claim 2, wherein the organic electroluminescence device further satisfies numerical formulae (1-2) and (2-2), $$n_2-0.25<m_2<n_2+0.25 \quad (1\text{-}2)$$

in the numerical formula (1-2), $n_2$ represents an integer of 0 or more, and $m_2$ represents an order of interference between the reflective electrode and a light emission center of the second emitting layer, $$m_2=2L_2/\lambda_2+\phi_2/2\pi \quad (2\text{-}3)$$

in the formula (2-2), $m_2$ represents the same as $m_2$ in the numerical formula (1-2), $L_2$ represents an optical distance (nm) between the reflective electrode and the light emission center of the second emitting layer, $\lambda_2$ represents a main peak wavelength (nm) of light emission from the second emitting layer, and $\Phi_2$ represents a phase change occurring when the light emission from the second emitting layer is reflected on the reflective electrode.

5. The organic electroluminescence device according to claim 4, wherein $n_2$ represents an integer from 0 to 3 in the formula (1-2).

6. The organic electroluminescence device according to claim 2, wherein the organic electroluminescence device further satisfies numerical formulae (1-1) and (2-1), $$n_1-0.25<m_1<n_1+0.25 \quad (1\text{-}1)$$

in the numerical formula (1-1), $n_1$ represents an integer of 0 or more, and $m_1$ represents an order of interference between the reflective electrode and a light emission center of the first emitting layer, $$m_1=2L_1/\lambda_1+\phi_1/2\pi \quad (2\text{-}3)$$

in the formula (2-1), $m_1$ represents the same as $m_1$ in the numerical formula (1-1), $L_1$ represents an optical distance (nm) between the reflective electrode and the light emission center of the first emitting layer, $\lambda_1$ represents a main peak wavelength (nm) of light emission from the first emitting layer, and $\Phi_1$ represents a phase change occurring when the light emission from the first emitting layer is reflected on the reflective electrode.

7. The organic electroluminescence device according to claim 6, wherein $n_1$ represents an integer from 0 to 3 in the formula (1-1).

8. The organic electroluminescence device according to claim 1, wherein a main peak wavelength of the light emission from the third emitting layer is in a range from 430 nm to 500 nm.

9. The organic electroluminescence device according to claim 1, wherein the hole transporting zone of the third emitting unit comprises two or more layers.

10. The organic electroluminescence device according to claim 1, wherein the second emitting unit further comprises a hole transporting zone of the second emitting unit between the first charge generating layer and the second emitting layer, the hole transporting zone of the second emitting unit is in contact with the first charge generating layer, and a thickness of the hole transporting zone of the second emitting unit is in a range from 5 nm to 40 nm.

11. The organic electroluminescence device according to claim 10, wherein the hole transporting zone of the second emitting unit comprises two or more layers.

12. The organic electroluminescence device according to claim 1, wherein the second emitting layer comprises a blue fluorescent compound.

13. The organic electroluminescence device according to claim 12, wherein a main peak wavelength of the light emission from the second emitting layer is in a range from 430 nm to 500 nm.

14. The organic electroluminescence device according to claim 1, wherein the first emitting unit further comprises a hole transporting zone of the first emitting unit between the anode and the first emitting layer, the hole transporting zone of the first emitting unit is in contact with the anode, and a thickness of the hole transporting zone of the first emitting unit is in a range from 5 nm to 40 nm.

15. The organic electroluminescence device according to claim 14, wherein the hole transporting zone of the first emitting unit comprises three or more layers.

16. The organic electroluminescence device according to claim 1, wherein the first emitting layer comprises a blue fluorescent compound.

17. The organic electroluminescence device according to claim 16, wherein a main peak wavelength of the light emission from the first emitting layer is in a range from 430 nm to 500 nm.

18. The organic electroluminescence device according to claim 1, wherein the anode is a reflective electrode and light is extracted through the cathode.

19. The organic electroluminescence device according to claim 1, wherein the cathode is a reflective electrode and light is extracted through the anode.

20. An electronic device comprising the organic electroluminescence device according to claim 1.

* * * * *